(12) United States Patent
Huang et al.

(10) Patent No.: US 12,476,197 B2
(45) Date of Patent: Nov. 18, 2025

(54) SEMICONDUCTOR DEVICE

(71) Applicant: Taiwan Semiconductor Manufacturing Company, Ltd., Hsinchu (TW)

(72) Inventors: Ching-Yu Huang, Hsinchu (TW); Shih-Wei Peng, Hsinchu (TW); Chia-Tien Wu, Taichung (TW); Wei-Cheng Lin, Taichung (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 612 days.

(21) Appl. No.: 17/854,451

(22) Filed: Jun. 30, 2022

(65) Prior Publication Data

US 2024/0006326 A1 Jan. 4, 2024

(51) Int. Cl.
*H01L 23/538* (2006.01)
*H01L 21/48* (2006.01)

(52) U.S. Cl.
CPC ........ *H01L 23/5386* (2013.01); *H01L 21/486* (2013.01); *H01L 23/5384* (2013.01)

(58) Field of Classification Search
CPC ............. H01L 23/5386; H01L 23/5384; H01L 21/486
USPC .......................................... 257/621
See application file for complete search history.

(56) References Cited

U.S. PATENT DOCUMENTS

2013/0285140 A1* 10/2013 Kagawa ............... H10D 30/665
438/270

OTHER PUBLICATIONS

U.S. Appl. No. 17/459,697, filed Aug. 27, 2021.

* cited by examiner

*Primary Examiner* — Tu-Tu V Ho
(74) *Attorney, Agent, or Firm* — Birch, Stewart, Kolasch & Birch, LLP

(57) ABSTRACT

A semiconductor device includes first and second conductive layers, a first epitaxial structure and a first via structure. The first conductive layer extends along a first direction, and provides a first reference voltage signal. The second conductive layer extends along the first direction, and is separated from the first conductive layer along a second direction. The first epitaxial structure is disposed between the first conductive layer and the second conductive layer, and has a first width along the first direction. The first via structure is disposed between the first conductive layer and the second conductive layer, and transmits the first reference voltage signal from the first conductive layer through the second conductive layer to the first epitaxial structure. The first via structure has a second width along the first direction. The second width is approximately equal to or larger than twice of the first width.

20 Claims, 21 Drawing Sheets

SEMICONDUCTOR DEVICE

BACKGROUND

A semiconductor device includes semiconductor elements, such as transistors, and power rails for providing reference voltage signals to the semiconductor elements. Various signal paths between the semiconductor elements and the power rails have various resistances which cause voltage drops of the reference voltage signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
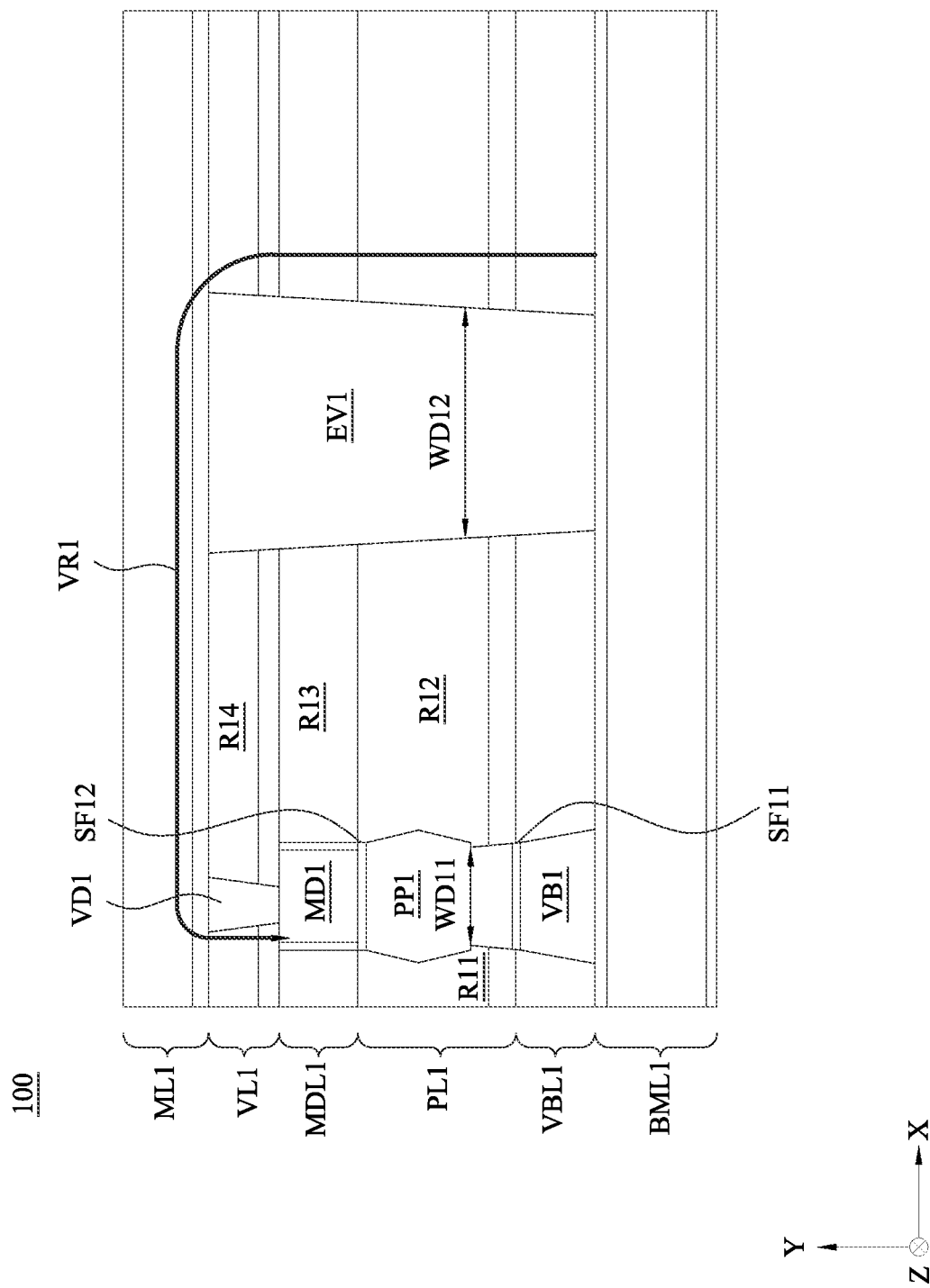
FIG. 1 is a cross section diagram of a semiconductor device, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a cross section diagram of a semiconductor device 100, in accordance with some embodiments of the present disclosure. In some embodiments, the semiconductor device 100 includes multiple layers. As illustratively shown in FIG. 1, the semiconductor device 100 includes conductive layers BML1, ML1, MDL1, via layers VBL1, VL1 and an epitaxial layer PL1. In some embodiments, the conductive layer BML1 corresponds to back-metal-zero (BM0) power rails or back-metal-one (BM1) power rails. The conductive layer ML1 corresponds to metal-zero (M0) mesh or metal-1 (M1) conductive segments. In various embodiments, the epitaxial layer PL1 includes various semiconductor elements, such as transistors.

As illustratively shown in FIG. 1, each of the conductive layers BML1, ML1, MDL1, the via layers VBL1, VL1, the epitaxial layer PL1 extends along an X-direction and a Z-direction. The conductive layer BML1, the via layer VBL1, the epitaxial layer PL1, the conductive layer MDL1, the via layer VL1 and the conductive layer ML1 are arranged in order along a Y-axis. In some embodiments, the X-direction, the Y-direction and the Z-direction are perpendicular with each other. The Z-direction points out from the paper.

In some embodiments, the via layer VBL1, the epitaxial layer PL1, the conductive layer MDL1 and the via layer VL1 include a via VB1, an epitaxial structure PP1, a conductive segment MD1 and a via VD1, respectively. In some embodiments, the semiconductor device 100 further includes films SF11 and SF12. As illustratively shown in FIG. 1, the via VB1 contacts with and is disposed between the conductive layer BML1 and the film SF11. The epitaxial structure PP1 contacts with and is disposed between the films SF11 and SF12. The via VD1 contacts with and is disposed between the conductive layer ML1 and the conductive segment MD1. The conductive segment MD1 contacts with and is disposed between the via VD1 and the film SF12.

In some embodiments, the epitaxial layer PL1 further includes isolation structures R11 and R12. As illustratively shown in FIG. 1, the epitaxial structure PP1 is disposed between the isolation structures R11 and R12, and has a width WD11 along the X-direction. In various embodiments, the epitaxial structure PP1 is implemented by a p-type material or an n-type material, and the isolation structures R11 and R12 are implemented by insulators.

In some embodiments, the semiconductor device 100 further includes a via structure EV1. As illustratively shown in FIG. 1, the via structure EV1 is disposed between and contact with the conductive layers BML1 and ML1, and is disposed through the via layer VBL1, the epitaxial layer PL1, the conductive layer MDL1, the via layer VL1. In some embodiments, the via structure EV1 has a width WD12 along the X-direction. In various embodiments, the width WD12 is approximately equal to or larger than twice of the width WD11.

In some embodiments, the conductive layer MDL1 further includes an isolation structure R13 disposed between the conductive segment MD1 and the via structure EV1. In some embodiments, the via layer VL1 further includes an isolation structure R14 disposed between the via VD1 and the via structure EV1. In some embodiments, the isolation structures R13 and R14 are implemented by insulators.

In some embodiments, the conductive layer BML1 is configured to provide a reference voltage signal VR1, and the via structure EV1 is configured to transmit the reference voltage signal VR1 from the conductive layer BML1 to the conductive layer ML1. The epitaxial structure PP1 is configured to receive the reference voltage signal VR1 from the via structure EV1 through the conductive layer ML1, the via VD1 and the conductive segment MD1 in order, and is configured to operate according to the reference voltage signal VR1.

In some approaches, a via structure transmits a reference voltage signal through a metal segment and a via to a conductive layer. In such approaches, the via structure has a width approximately equal to an epitaxial structure. As a result, a resistance to the conductive layer is large and a voltage level of the reference voltage signal is reduced.

Compared to the above approaches, in some embodiments of the present disclosure, the via structure EV1 is configured to transmit the reference voltage signal VR1 from the conductive layer BML1 to the conductive layer ML1 directly, and the via structure EV1 has the width WD12 approximately equal to or larger than twice of the width WD11. As a result, a resistance from the conductive layer BML1 through the via structure EV1 to the conductive layer ML1 is small and a voltage level of the reference voltage signal VR1 is maintained.

In some embodiments, the via structure EV1 is implemented by copper (Cu). At least one of the conductive segment MD1, the vias VB1 and VD1 is implemented by cobalt (Co), tungsten (W) and/or ruthenium (Ru). The epitaxial structure PP1 is implemented by silicon (Si), silicon-germanium (SiGe) and/or silicon-phosphorus (SiP). The isolation structures R11-R14 are implemented by silicon-oxide (SiO) and/or tetraethoxysilane (TEOS). The films SF11 and SF12 are implemented by titanium (Ti), titanium nitride (TiN) and/or titanium silicide (TiSi).

Figure 2A:
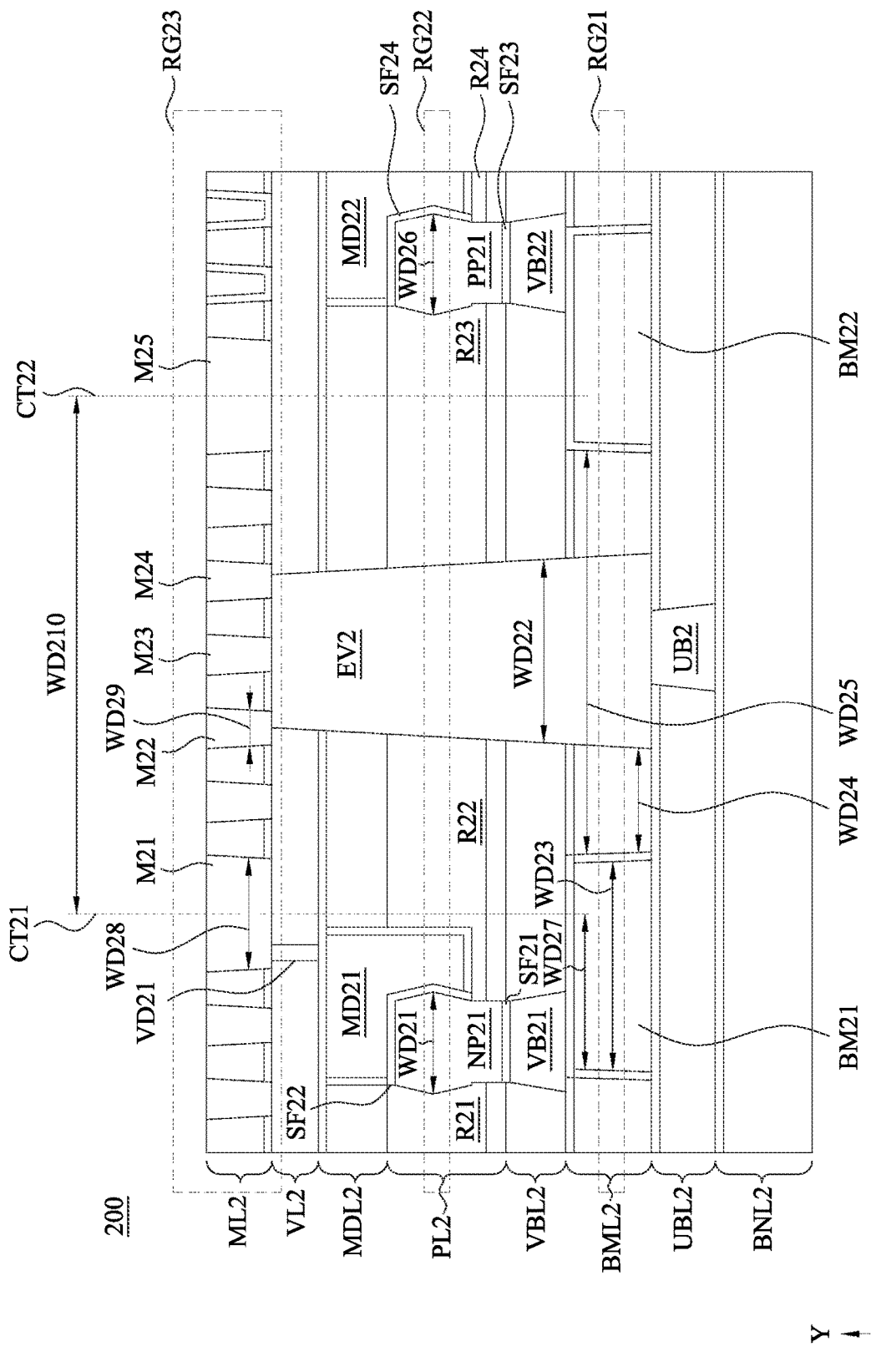
FIG. 2A is a cross section diagram of a semiconductor device corresponding to the semiconductor device shown in FIG. 1, in accordance with some embodiments of the present disclosure.

FIG. 2A is a cross section diagram of a semiconductor device 200 corresponding to the semiconductor device 100 shown in FIG. 1, in accordance with some embodiments of the present disclosure. As illustratively shown in FIG. 2A, the semiconductor device 200 includes regions RG21-RG23. Further details of the regions RG21-RG23 are described below with embodiments associated with the FIG. 2B to FIG. 2D.

In some embodiments, the semiconductor device 200 includes multiple layers. As illustratively shown in FIG. 2A, the semiconductor device 200 includes conductive layers BML2, BNL2, ML2, MDL2, via layers UBL2, VBL2, VL2, an epitaxial layer PL2 and a via structure EV2. In some embodiments, the conductive layers BML2 and BNL2 correspond to back-metal-zero (BM0) power rails and back-metal-one (BM1) signal rails, respectively. The via structure EV2 is disposed through the conductive layers BML2, MDL2, the via layers VBL2, VL2, the epitaxial layer PL2.

As illustratively shown in FIG. 2A, each of the conductive layers BML2, BNL2, ML2, MDL2, the via layers UBL2, VBL2, VL2, the epitaxial layer PL2 extends along the X-direction and the Z-direction. The conductive layer BNL2, the via layer UBL2, the conductive layer BML2, the via layer VBL2, the epitaxial layer PL2, the conductive layer MDL2, the via layer VL2 and the conductive layer ML2 are arranged in order along the Y-axis.

In some embodiments, the via layer VBL2 includes a via UB2. The conductive layer BML2 includes conductive segments BM21 and BM22. The via layer VBL2 includes vias VB21 and VB22. The epitaxial layer PL2 includes epitaxial structures PP21, NP21 and isolation structures R21-R24. The epitaxial layer PL2 and the conductive layer MDL2 include conductive segments MD21 and MD22. The conductive layer ML2 includes conductive segments M21-M25. The via layer VL2 includes via VD21. In some embodiments, the semiconductor device 200 further includes films SF21-SF24.

Referring to FIG. 1 and FIG. 2A, the semiconductor device 200 is an alternative embodiment of the semiconductor device 100. The conductive layers BNL2, ML2, MDL2, the via layers VBL2, VL2, the epitaxial layer PL2 and the via structure EV2 correspond to the conductive layers BML1, ML1, MDL1, the via layers VBL1, VL1, the epitaxial layer PL1 and the via structure EV1, respectively. The conductive segments vias VB21 and VB22 correspond to the via VB1. The epitaxial structures PP21, NP21 correspond to the epitaxial structure PP1. The films SF21 and SF23 correspond to the film SF11. The films SF22 and SF24 correspond to the film SF12. The isolation structures R21 and R24 correspond to the isolation structures R11. The isolation structures R22 and R23 correspond to the isolation structures R12. The conductive segments MD21 and MD22 correspond to the conductive segment MD1. The via VD21 correspond to the via VD1. Therefore, some descriptions are not repeated for brevity.

As illustratively shown in FIG. 2A, the via UB2 contacts with and is disposed between the conductive layer BNL2 and a first side of the via structure EV2. A second side of the via structure EV2 contacts with the conductive segments M22-M24. The conductive segments M21-M25 are arranged in the X-direction in order. In some embodiments, at least one of the conductive segments M22-M24 is coupled to the conductive segment M21 through a conductive segment crossing over the conductive segments M21-M25, such as a conductive segment MP21 shown in FIG. 2D.

As illustratively shown in FIG. 2A, the via VD21 contacts with and is disposed between the conductive segments M21 and MD21. The film SF22 contacts with and is disposed between the conductive segment MD21 and the epitaxial structure NP21. The film SF21 contacts with and is disposed between the via VB21 and the epitaxial structure NP21. The conductive segment BM21 contacts with the via VB21, and is configured to provide a reference voltage signal, such as a reference voltage signal VDD shown in FIG. 2B, to the epitaxial structure NP21 through the via VB21.

As illustratively shown in FIG. 2A, the isolation structure R21, the epitaxial structure NP21, the isolation structure R22, the via structure EV2, the isolation structure R23, the epitaxial structure PP21, the isolation structure R24 are arranged in order along the X-direction. In some embodiments, the epitaxial structures PP21 and NP21 are implemented by a p-type material and an n-type material, respectively.

As illustratively shown in FIG. 2A, along the X-direction, the epitaxial structure NP21, the via structure EV2, the conductive segment BM21, the epitaxial structure PP21, the conductive segments M21 and M22 have widths WD21, WD22, WD23, WD26, WD28 and WD29, respectively. In some embodiments, the conductive segment BM22 and the conductive segment M25 have the widths WD23 and WD28, respectively. Each of the conductive segments M23 and M24 has the width WD29.

As illustratively shown in FIG. 2A, the conductive segments BM21 and BM22 are separated from each other along the X-direction by a width WD25. The conductive segments BM21 is separated from the via structure EV2 along the X-direction by a width WD24. An edge of the conductive segments BM21 is separated from a center CT21 of the conductive segment M21 along the X-direction by a width WD27. The center CT21 is separated from a center CT22 of the conductive segment M25 along the X-direction by a width WD210.

In some embodiments, each of the widths WD21 and WD26 is approximately equal to 5-200 nanometer. The width WD28 is approximately equal to 10-100 nanometer. The width WD29 is approximately equal to 5-30 nanometer. The width WD210 is approximately equal to 50-300 nanometer. The width WD27 is approximately equal to 5-75 nanometer. The width WD24 is approximately equal to 0-250 nanometer. The width WD23 is approximately equal to 5-150 nanometer. The width WD25 is approximately equal to 10-150 nanometer. The width WD22 is approximately equal to 10-300 nanometer.

In some embodiments, the conductive layer BNL2 is configured to provide the reference voltage signal, and the via structure EV2 is configured to transmit the reference voltage signal from the conductive layer BNL2 to the conductive segments M22-M24. The epitaxial structure NP21 is configured to receive the reference voltage signal from the via structure EV2 through at least one of the conductive segments M22-M24, the conductive segment M21, the via VD21 and the conductive segment MD21 in order, and is configured to operate according to the reference voltage signal. In some embodiments, the conductive segment BM21 is configured to receive the reference voltage signal from the conductive layer BNL2 through a via included in the via layer UBL2, such as the via UB21 shown in FIG. 2B.

Figure 2B:
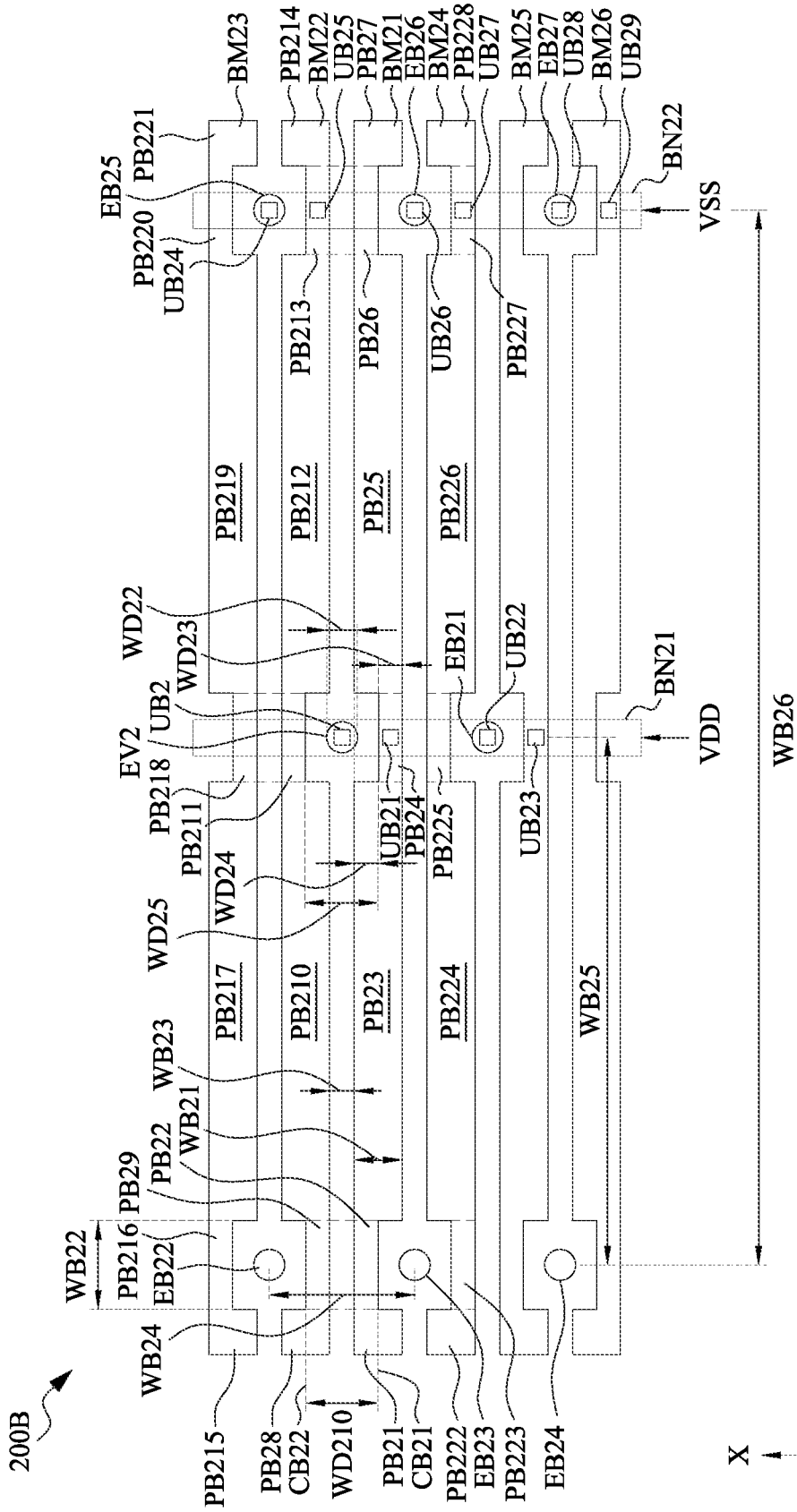
FIG. 2B is a layout diagram of a first region of the semiconductor device shown in FIG. 2A, in accordance with some embodiments of the present disclosure.

FIG. 2B is a layout diagram 200B of the region RG21 of the semiconductor device 200 shown in FIG. 2A, in accordance with some embodiments of the present disclosure. As illustratively shown in FIG. 2B, in the layout diagram 200B, the Y-direction points out from the paper.

In some embodiments, the semiconductor device 200 further includes via structures EB21-EB27, conductive segments BM23-BM26, BN21, BN22 and vias UB21-UB29. As illustratively shown in FIG. 2B, each of the conductive segments BM21-BM26 extends along the Z-direction. Each of the conductive segments BN21-BN22 extends along the X-direction. In some embodiments, each of the via structures EV2 and EB21-EB27 is separated from the conductive segments BM21-BM26 along the X-direction.

Referring to FIG. 2A and FIG. 2B, each of the via structures EB21-EB27 is similar with the via structure EV2, is disposed through the conductive layers BML2, MDL2, the via layers VL2, VBL2 and the epitaxial layer PL2, and is configured to transmit one of reference voltage signals VDD and VSS to the conductive layer ML2. Similar with the conductive segments BM21 and BM22, the conductive segments BM23-BM26 are also included in the conductive layer BML2. The conductive segments BN21, BN22 are included in the conductive layer BNL2. The vias UB21-UB29 are included in the via layer VBL2.

As illustratively shown in FIG. 2B, the conductive segment BM21 includes portions PB21-PB27 arranged in order along the Z-direction. The conductive segment BM22 includes portions PB28-PB214 arranged in order along the Z-direction. The conductive segment BM23 includes portions PB218-PB221 arranged in order along the Z-direction. The conductive segment BM24 includes portions PB222-PB228 arranged in order along the Z-direction.

In some embodiments, each of the portions PB21, PB23, PB25, PB27, PB28, PB210, PB212, PB214, PB215, PB217, PB219, PB221, PB222, PB224, PB226 and PB228 has a width WB21 along the X-direction. Each of portions PB22, PB24, PB26, PB29, PB211, PB213, PB216, PB218, PB220, PB223, PB225 and PB227 has the width WD23 along the X-direction, and has a width WB22 along the Z-direction.

As illustratively shown in FIG. 2B, the width WB21 is longer than the width WD23. In some embodiments, the portions PB21, PB23, PB25, PB27, PB28, PB210, PB212, PB214, PB215, PB217, PB219, PB221, PB222, PB224, PB226 and PB228 are referred to as longer portions, and the portions PB22, PB24, PB26, PB29, PB211, PB213, PB216, PB218, PB220, PB223, PB225 and PB227 are referred to as shorter portions.

In some embodiments, centers of adjacent two of the conductive segments BM21-BM26 are separated from each other along the X-direction by the width WD210. For example, as illustratively shown in FIG. 2B, a center CB21 of the conductive segment BM21 and a center CB22 of the conductive segment BM22 are separated from each other along the X-direction by the width WD210. In some embodiments, a center of the conductive segment BM23 and the center CB22 are separated from each other along the X-direction by the width WD210. A center of the conductive segment BM24 and the center CB21 are separated from each other along the X-direction by the width WD210.

In some embodiments, centers the conductive segments BM21-BM26 correspond to edges of the shorter portions. For example, the center CB21 corresponds to edges of the shorter portions PB22, PB24 and PB26. The center CB22 corresponds to edges of the shorter portions PB29, PB211 and PB213.

In some embodiments, longer portions of adjacent two of the conductive segments BM21-BM26 are separated from each other along the X-direction by a width WB23. For example, as illustratively shown in FIG. 2B, the longer portions PB23 and PB210 are separated from each other along the X-direction by the width WB23. For another example, the longer portions PB25 and PB212 are separated from each other along the X-direction by the width WB23.

As illustratively shown in FIG. 2B, the via structure EV2 is disposed between the portions PB24 and PB211 along the X-direction, is disposed between the portions PB23 and PB25 along the Z-direction, and is disposed between the portions PB210 and PB212 along the Z-direction. The via structure EB21 is disposed between the portion PB225 and a shorter portion of the conductive segment BM25 along the X-direction, and is disposed between the portions PB224 and PB226 along the Z-direction.

As illustratively shown in FIG. 2B, the via structure EB22 is disposed between the portions PB29 and PB216 along the X-direction, is disposed between the portions PB215 and PB217 along the Z-direction, and is disposed between the portions PB28 and PB210 along the Z-direction. The via structure EB23 is disposed between the portions PB22 and PB223 along the X-direction, is disposed between the portions PB21 and PB23 along the Z-direction, and is disposed between the portions PB222 and PB224 along the Z-direction. The via structure EB24 is disposed between portions of the conductive segments BM25 and BM26.

As illustratively shown in FIG. 2B, the via structure EB25 is disposed between the portions PB220 and PB213 along the X-direction, is disposed between the portions PB219 and PB221 along the Z-direction, and is disposed between the portions PB212 and PB214 along the Z-direction. The via structure EB26 is disposed between the portions PB26 and PB227 along the X-direction, is disposed between the portions PB25 and PB27 along the Z-direction, and is disposed between the portions PB226 and PB228 along the Z-direction. The via structure EB27 is disposed between portions of the conductive segments BM25 and BM26.

In some embodiments, two shorter portions disposed at two sides of a via structure, such as the via structures EV2 and EB21-EB27, are separated from each other along the X-direction by the width WD25. For example, as illustratively shown in FIG. 2B, the portions PB24 and PB211 disposed at two sides of the via structure EV2 are separated from each other along the X-direction by the width WD25. For another example, the portions PB26 and PB227 disposed at two sides of the via structure EB26 are separated from each other along the X-direction by the width WD25.

As illustratively shown in FIG. 2B, along the X-direction, the via structures EB22-EB24 are aligned with each other, the via structures EB25-EB27 are aligned with each other, and the via structures EB21 and EV2 are aligned with each other. Along the Z-direction, the via structures EB22 and EB25 are aligned with each other, the via structures EB23 and EB26 are aligned with each other, and the via structures EB24 and EB27 are aligned with each other.

In some embodiments, along the X-direction, two aligned via structures are separated from each other by a width WB24. For example, as illustratively shown in FIG. 2B, the via structures EB22 and EB23 are separated from each other along the X-direction by the width WB24.

In some embodiments, along the Z-direction, two aligned via structures are separated from each other by a width WB26. For example, as illustratively shown in FIG. 2B, the via structures EB24 and EB27 are separated from each other along the Z-direction by the width WB26.

In some embodiments, along the Z-direction, two via structures disposed at two sides of one of the conductive segments BM21-BM26 are separated from each other by a width WB25. For example, as illustratively shown in FIG. 2B, the via structures EB24 and EB21, which are disposed at two sides of the conductive segment BM25, are separated from each other along the Z-direction by the width WB25. For another example, along the Z-direction, the via structure EV2 is separated from each of the via structures EB22-EB27 by the width WB25.

In some embodiments, the width WB21 is approximately equal to 10-150 nanometer. The width WB23 is approximately equal to 10-150 nanometer. The width WB22 is approximately equal to 30-600 nanometer. The width WB26 is approximately equal to 50-10000 nanometer. The width WB25 is approximately equal to 0-10000 nanometer. The width WB24 is approximately equal to 50-10000 nanometer.

In some embodiments, the width WB21 is approximately equal to twice of the width WD27. The width WB210 is approximately equal to the width WB21 plus the width WB23. The width WB21 is approximately equal to the width WD24 plus the width WD23. The width WD23 plus twice of the width WD24 is approximately equal to twice of the width WB21 plus the width WB23. In some embodiments, each of the widths WB22, WB26 and WB25 corresponds to a corresponding integer number of poly-pitches. The width WB24 corresponds to an integer number of cell-heights.

As illustratively shown in FIG. 2B, the conductive segment BN21 is coupled to the via structures EV2, EB21 and the conductive segments BM25, BM21 through the vias UB2, UB22, UB23 and UB21, respectively. The conductive segment BN22 is coupled to the via structures EB25-EB27 and the conductive segment BM22, BM24 BM26 through the vias UB24, UB26, UB28, UB25, UB27 and UB29, respectively.

In some embodiments, the conductive segments BN21 and BN22 are configured to provide different reference voltage signal to corresponding via structures and conductive segments. As illustratively shown in FIG. 2B, the conductive segment BN21 is configured to provide the reference voltage signal VDD to the via structures EV2, EB21 and the conductive segments BM25, BM21. The conductive segment BN22 is configured to provide the reference voltage signal VSS to the via structures EB25-EB27 and the conductive segment BM22, BM24, BM26. In some embodiments, a voltage level of the reference voltage signal VDD is higher than a voltage level of the reference voltage signal VSS.

Figure 2C:
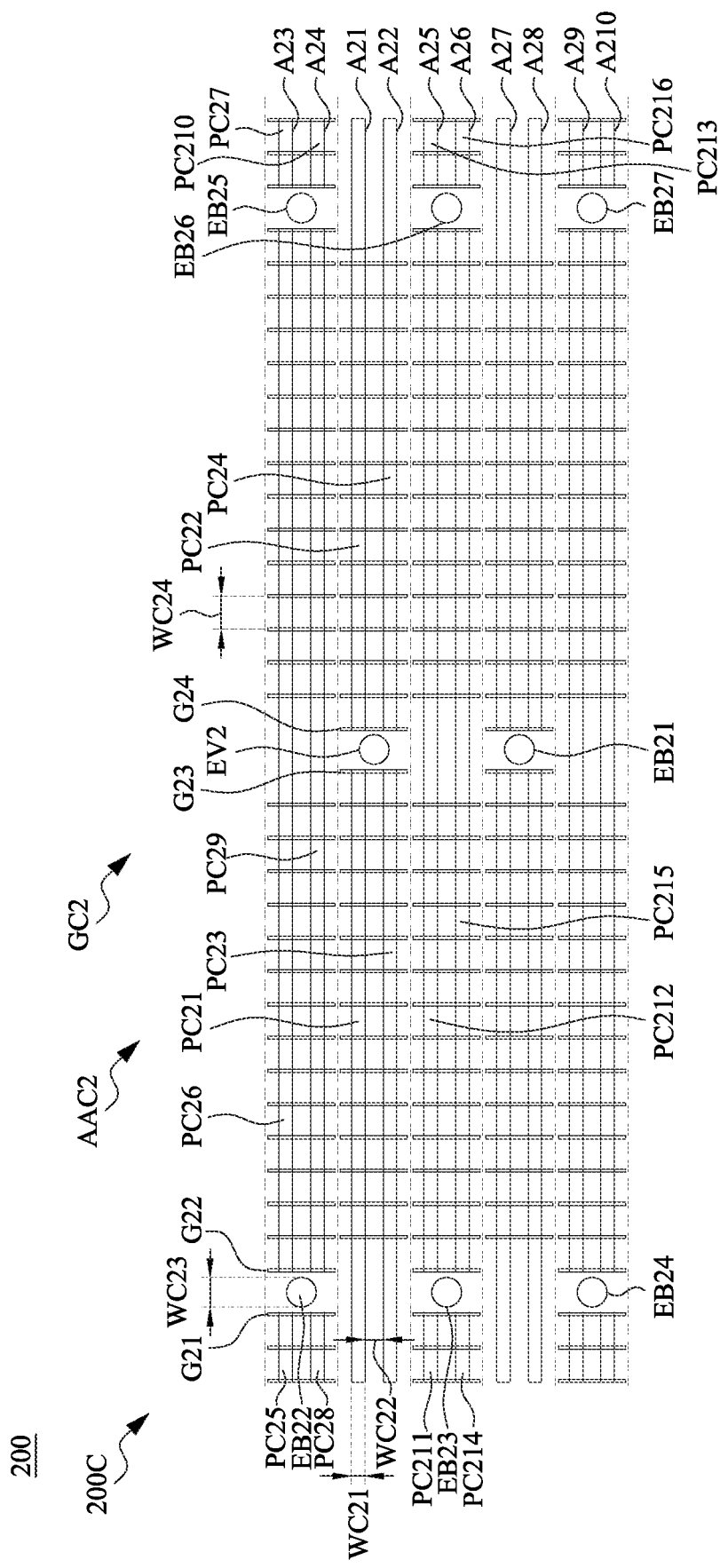
FIG. 2C is a layout diagram of a second region of the semiconductor device 200 shown in FIG. 2A, in accordance with some embodiments of the present disclosure.

FIG. 2C is a layout diagram 200C of the region RG22 of the semiconductor device 200 shown in FIG. 2A, in accordance with some embodiments of the present disclosure. As illustratively shown in FIG. 2C, in the layout diagram 200C, the Y-direction points out from the paper.

In some embodiments, the semiconductor device 200 further includes active areas AAC2 and gate structures GC2. As illustratively shown in FIG. 2C, the active areas AAC2 extend along the Z-direction, and the gate structures GC2 extend along the X-direction. The gate structures GC2 cross over corresponding ones of the active areas AAC2. In some embodiments, the active areas AAC2 and the gate structures GC2 forms multiple semiconductor elements, such as transistors. Referring to FIG. 2A and FIG. 2C, the active areas AAC2 and the gate structures GC2 are included in the epitaxial layer PL2. In some embodiments, the active areas AAC2 are implemented by oxide-diffusion (OD) material, and the gate structures GC2 are implemented by poly material.

In some embodiments, the active areas AAC2 includes active areas A21-A210. As illustratively shown in FIG. 2C, the active areas A210, A29, A28, A27, A26, A25, A22, A21, A24 and A23 are arranged in order along the X-direction. Each of the active areas A21-A210 has a width WC21 along the X-direction. Adjacent two of the active areas A21-A210 are separated from each other along the X-direction by a width WC22. The epitaxial structures NP21 and PP21 shown in FIG. 2A correspond to the active areas A25 and A24, respectively.

In some embodiments, each of the active areas A21-A210 includes multiple active area portions separated from each other along the Z-direction. As illustratively shown in FIG. 2C, the active area A21 includes portions PC21 and PC22 separated from each other and arranged in order along the Z-direction. The active area A22 includes portions PC23 and PC24 separated from each other and arranged in order along the Z-direction. The active area A23 includes portions PC25-PC27 separated from each other and arranged in order along the Z-direction. The active area A24 includes portions PC28-PC210 separated from each other and arranged in order along the Z-direction. The active area A25 includes portions PC211-PC213 separated from each other and arranged in order along the Z-direction. The active area A26 includes portions PC214-PC216 separated from each other and arranged in order along the Z-direction.

In some embodiments, the via structures EV2 and EB21-EB27 are disposed between portions of the active areas A21-A210. As illustratively shown in FIG. 2C, along the Z-direction, the via structure EV2 is disposed between the portions PC21 and PC22 and is disposed between the portions PC23 and PC24. The via structure EB22 is disposed between the portions PC25 and PC26 and is disposed between the portions PC28 and PC29. The via structure EB23 is disposed between the portions PC211 and PC212 and is disposed between the portions PC214 and PC215. The via structure EB25 is disposed between the portions PC26 and PC27 and is disposed between the portions PC29 and PC210. The via structure EB26 is disposed between the portions PC212 and PC213 and is disposed between the portions PC215 and PC216.

As illustratively shown in FIG. 2C, along the Z-direction, the via structure EB21 is disposed between the portions of the active areas A27 and A28. Each of the via structures EB24 and EB27 is disposed between the portions of the active areas A29 and A210.

In some embodiments, the gate structures GC2 includes gate structures G21-G24. Adjacent two of the gate structures GC2 are separated from each other along the Z-direction by a width WC24. As illustratively shown in FIG. 2C, the gate structures G21-G24 are arranged in order along the X-direction. The gate structure G21 is crossing over the portions PC25 and PC28. The gate structure G22 is crossing over the portions PC26 and PC29. The gate structure G23 is crossing over the portions PC21 and PC23. The gate structure G24 is crossing over the portions PC22 and PC24.

In some embodiments, each of the via structures EV2 and EB21-EB27 is disposed between two of gate structures GC2. As illustratively shown in FIG. 2C, the via structure EV2 is disposed between the gate structures G23 and G24. The via structure EB22 is disposed between the gate structures G22 and G21.

In some embodiments, each of the via structures EV2 and EB21-EB27 has a width WC23 along the Z-direction. The gate structures disposed at two sides of one of the via structures EV2 and EB21-EB27 are separated from each other along the Z-direction by the width WC23. For example, the gate structures G21 and G22 disposed at two sides of the via structure EB22 are separated from each other by the width WC23, and the gate structures G23 and G24 disposed at two sides of the via structure EV2 are separated from each other by the width WC23. In some embodiments, the width WC23 corresponds to an integer number of poly pitches.

Figure 2D:
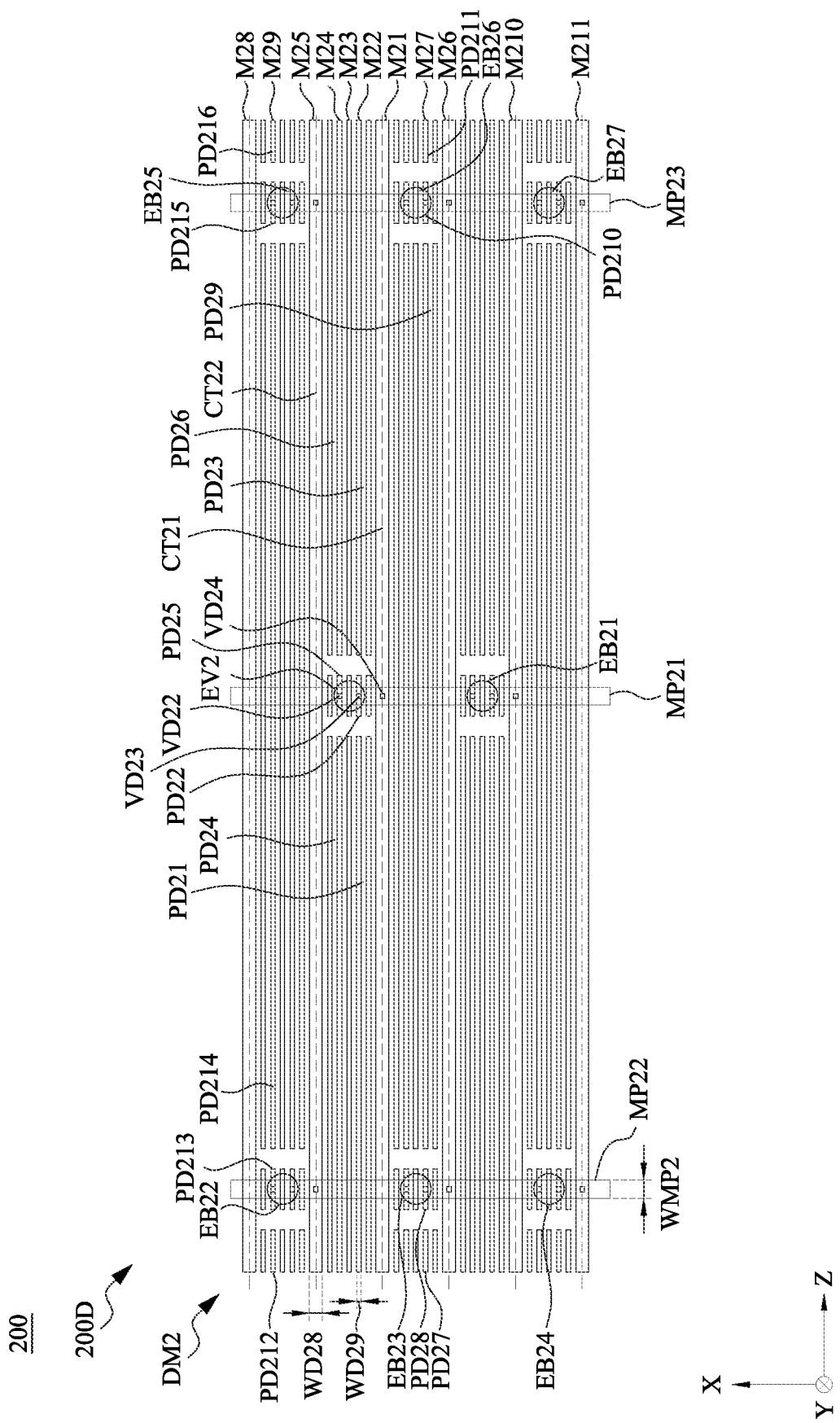
FIG. 2D is a layout diagram of a third region of the semiconductor device shown in FIG. 2A, in accordance with some embodiments of the present disclosure.

FIG. 2D is a layout diagram 200D of the region RG23 of the semiconductor device 200 shown in FIG. 2A, in accordance with some embodiments of the present disclosure. As illustratively shown in FIG. 2D, in the layout diagram 200D, the Y-direction points out from the paper.

In some embodiments, the semiconductor device 200 further includes conductive segments DM2, MP21-MP23 and vias VD22-VD24. The conductive segments DM2 includes conductive segments M21-M211. As illustratively shown in FIG. 2D, each of the conductive segments DM2 extends along the Z-direction. Each of the conductive segments MP21-MP23 extends along the X-direction and crosses over the conductive segments DM2. The conductive segments MP22, MP21 and MP23 are arranged in order along the Z-direction.

Referring to FIG. 2A and FIG. 2D, the conductive segments DM2 are included in the conductive layer ML2. The conductive segments MP21-MP23 are included in a conductive layer (not shown in figures) disposed above the conductive layer ML2. The vias VD22-VD24 are disposed between the conductive layer of the conductive segments MP21-MP23 and the conductive layer ML2.

As illustratively shown in FIG. 2D, the conductive segments M211, M210, M26, M27, M21-M25, M29 and M28 are arranged in order along the X-direction. The conductive segment M22 includes portions PD21-PD23. The conductive segment M24 includes portions PD24-PD26. The conductive segment M27 includes portions PD27-PD211. The conductive segment M29 includes portions PD212-PD216.

As illustratively shown in FIG. 2D, along the X-direction, the portions PD21-PD23 are arranged in order, the portions PD24-PD26 are arranged in order, the portions PD27-PD211 are arranged in order, and the portions PD212-PD216 are arranged in order. The portions PD21-PD216 are separated from each other.

As illustratively shown in FIG. 2D, the conductive segment MP21 crosses over the portions PD22, PD25, PD29 and PD214. The conductive segment MP22 crosses over the portions PD21, PD24, PD213 and PD28. The conductive segment MP23 crosses over the portions PD23, PD26, PD215 and PD210.

In some embodiments, one of the conductive segments MP21-MP23 is coupled to corresponding via structures and conductive segments through vias and portions. For example, the conductive segment MP21 is coupled to the via structure EV2 through vias VD22, VD23 and portions PD22 and PD25, is coupled to the via structure EB21 through corresponding portions and vias, is coupled to the conductive segment M21 through a via VD24, and is coupled to the conductive segment M210 through a corresponding via.

For another example, the conductive segment MP22 is coupled to the via structure EB22 through portion PD213, is coupled to the via structure EB23 through the portion PD28, is coupled to the via structure EB24 through corresponding portions, and is coupled to the conductive segments M211, M26 and M25 through corresponding vias.

For further example, the conductive segment MP23 is coupled to the via structure EB25 through portion PD215, is coupled to the via structure EB26 through the portion PD210, is coupled to the via structure EB27 through corresponding portions, and is coupled to the conductive segments M211, M26 and M25 through corresponding vias.

In some embodiments, the conductive segments DM2 correspond to signal tracks and power rails. Some of the conductive segments DM2 correspond to the signal tracks and are configured to receive reference voltage signals from the via structures EV2 and EB21-EB27. Some of the conductive segments DM2 correspond to the power rails and are configured to receive reference voltage signals from the conductive segments MP21-MP23.

In the embodiment shown in FIG. 2D, the conductive segments M21, M25, M26, M28, M210 and M211 correspond to the power rails, and the conductive segments M22-M24, M27 and M29 correspond to the signal tracks. The portions PD22 and PD25 are configured to receive the reference voltage signal VDD from the via structure EV2, and transmit the reference voltage signal VDD to the conductive segment MP21. The portions coupled to the via structure EB21 is configured to transmit the reference voltage signal VDD from the via structure EB21 to the conductive segment MP21. The conductive segments M21 and M210 are configured to receive the reference voltage signal VDD from the conductive segment MP21.

In the embodiment shown in FIG. 2D, the portion PD213 is configured to receive the reference voltage signal VSS from the via structure EB22, and transmit the reference voltage signal VSS to the conductive segment MP22. The portion PD28 is configured to receive the reference voltage signal VSS from the via structure EB23, and transmit the reference voltage signal VSS to the conductive segment MP22. The portions coupled to the via structure EB24 is configured to transmit the reference voltage signal VSS to the conductive segment MP22. The conductive segments M25, M26 and M211 are configured to receive the reference voltage signal VSS from the conductive segment MP22.

In the embodiment shown in FIG. 2D, the portion PD215 is configured to receive the reference voltage signal VSS from the via structure EB25, and transmit the reference voltage signal VSS to the conductive segment MP23. The portion PD210 is configured to receive the reference voltage signal VSS from the via structure EB26, and transmit the reference voltage signal VSS to the conductive segment MP23. The portions coupled to the via structure EB27 is configured to transmit the reference voltage signal VSS to the conductive segment MP23. The conductive segments M25, M26 and M211 are also configured to receive the reference voltage signal VSS from the conductive segment MP23.

In some embodiments, along the X-direction, each of the conductive segments corresponding to the signal tracks has a width WD29, and each of the conductive segments corresponding to the power rails has a width WD28. For example, each of the conductive segments M22-M24, M27 and M29 has the width WD29, and each of the conductive segments M21, M25, M26, M28, M210 and M211 has the width WD28. In some embodiments, each of the conductive segments MP21-MP23 has a width WMP2 along the Z-direction.

In some embodiments, the width WD29 is approximately equal to 5-30 nanometer. The width WD28 is approximately equal to 10-100 nanometer. The width WMP2 is approximately equal to 10-100 nanometer.

In the embodiment shown in FIG. 2D, five conductive segments corresponding to the signal tracks are disposed between two conductive segments corresponding to the power rails. For example, the conductive segments M22-M24 and other two conductive segments are disposed between the conductive segments M21 and M25. In various embodiment, various numbers of conductive segments corresponding to the signal tracks, such as three to eight conductive segments, are disposed between two conductive segments corresponding to the power rails.

Figure 2E:
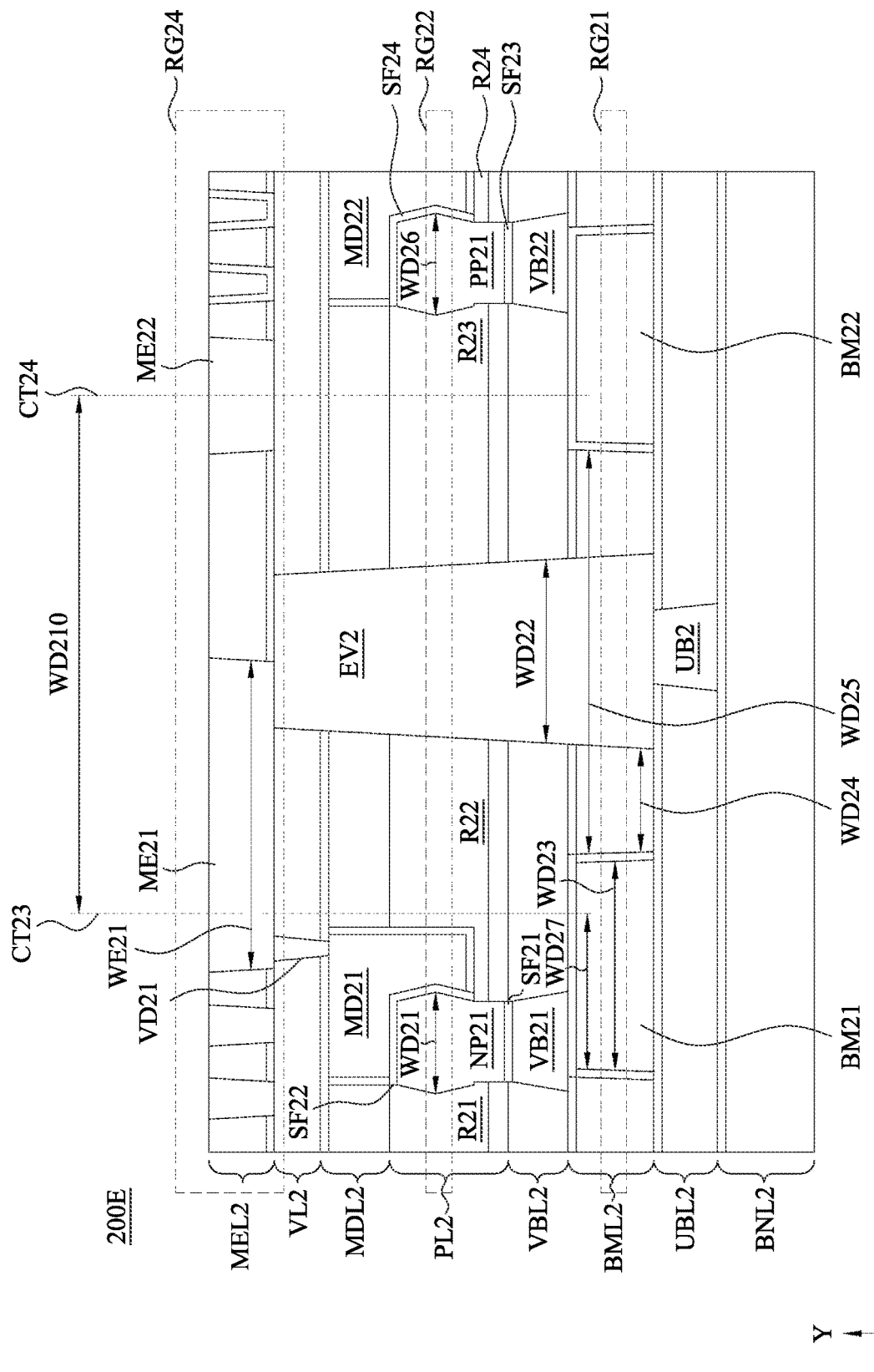
FIG. 2E is a cross section diagram of a semiconductor device corresponding to the semiconductor device shown in FIG. 1, in accordance with some embodiments of the present disclosure.

FIG. 2E is a cross section diagram of a semiconductor device 200E corresponding to the semiconductor device 100 shown in FIG. 1, in accordance with some embodiments of the present disclosure. In the embodiment shown in FIG. 2E, the Z-direction points out from the paper.

Referring to FIG. 2E and FIG. 2A, the semiconductor device 200E is an alternative embodiment of the semiconductor device 200A. FIG. 2E follows a similar labeling convention to that of FIG. 2A. For brevity, the discussion will focus more on differences between FIG. 2A and FIG. 2E than on similarities.

Referring to FIG. 2E and FIG. 2A, instead of the conductive layer ML2, the semiconductor device 200E includes a conductive layer MEL2. The conductive layer MEL2 is disposed above and contacts with the via layer VL2. A region RG24 of the semiconductor device 200E corresponds to the conductive layer MEL2.

In some embodiments, the conductive layer MEL2 includes conductive segments ME21 and ME22 arranged in order along the X-direction. As illustratively shown in FIG. 2E, along the X-direction, a center CT23 of the conductive segment ME21 is separated from a center CT24 of the conductive segment ME22 by the width WD210, the conductive segment ME21 has a width WE21, and the center CT23 is separated from the edge of the conductive segment BM21 by the width WD27.

In some embodiments, the conductive segment ME21 contacts with the via structure EV2 and the via VD21, and configured to transmit a reference voltage signal from the via structure EV2 to the via VD21.

Figure 2F:
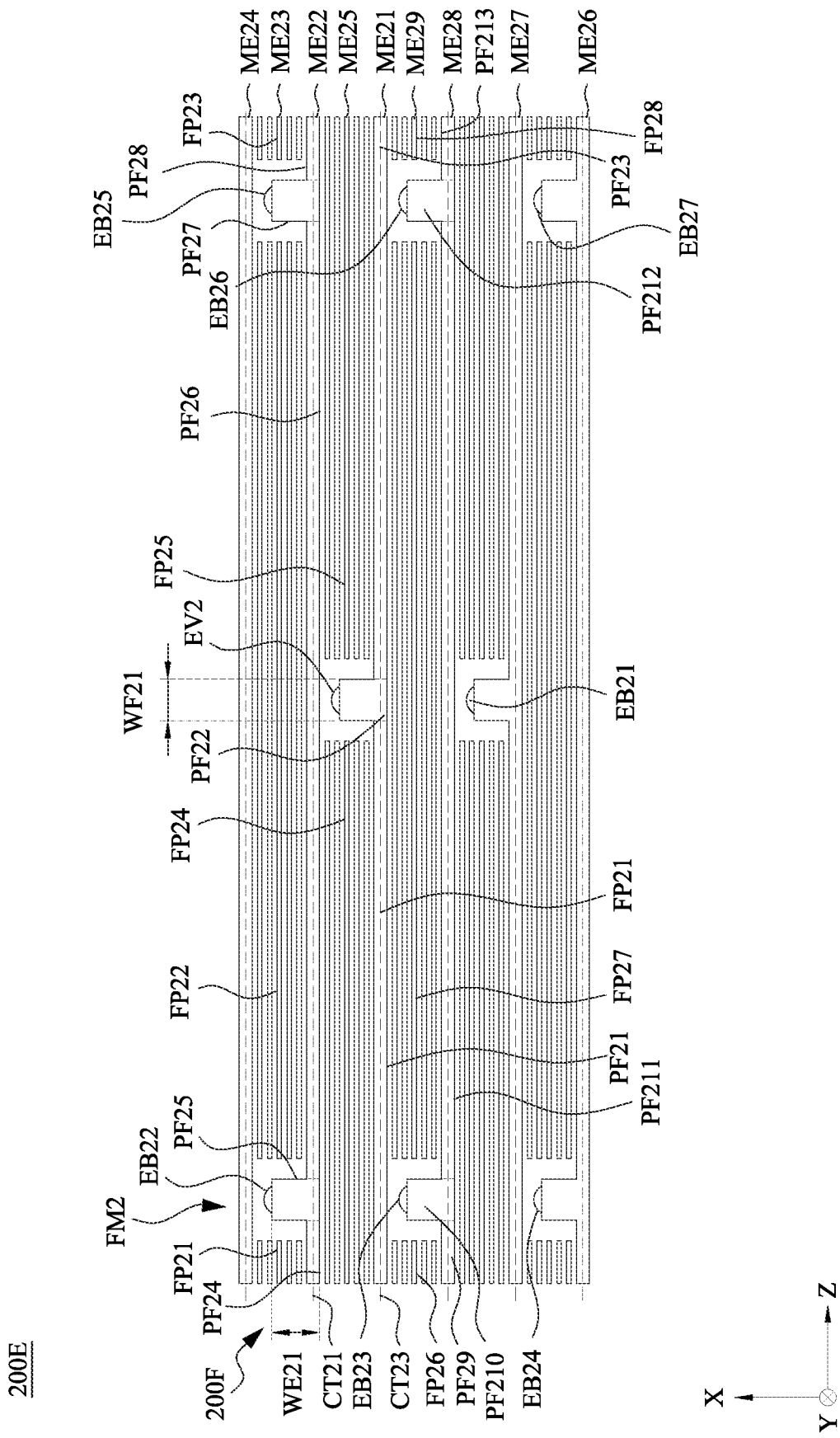
FIG. 2F is a layout diagram of a region of the semiconductor device shown in FIG. 2E, in accordance with some embodiments of the present disclosure.

FIG. 2F is a layout diagram 200F of the region RG24 of the semiconductor device 200E shown in FIG. 2E, in accordance with some embodiments of the present disclosure. As illustratively shown in FIG. 2F, in the layout diagram 200F, the Y-direction points out from the paper.

In some embodiments, the semiconductor device 200E further includes conductive segments FM2. The conductive segments FM2 includes conductive segments ME21-ME29. As illustratively shown in FIG. 2F, each of the conductive segments FM2 extends along the Z-direction. Referring to FIG. 2E and FIG. 2F, the conductive segments FM2 are included in the conductive layer MEL2.

As illustratively shown in FIG. 2F, the conductive segments ME26-ME29, ME21, ME25 and ME22-ME24 are arranged in order along the X-direction. The conductive segment ME21 includes portions PF21-PF23 arranged in order along the Z-direction. The conductive segment ME22 includes portions PF24-PF28 arranged in order along the Z-direction. The conductive segment ME28 includes portions PF29-PF213 arranged in order along the Z-direction.

As illustratively shown in FIG. 2F, the conductive segment ME23 includes portions FP21-FP23 arranged in order along the Z-direction. The conductive segment ME25 includes portions FP24-FP25 arranged in order along the Z-direction. The conductive segment ME29 includes portions FP26-FP28 arranged in order along the Z-direction. The portions FP21-FP28 are separated from each other.

As illustratively shown in FIG. 2F, the portion PF22 is disposed between the portions FP24 and FP25, and contacts with the via structure EV2 to receive the reference voltage signal VDD. The portion PF25 is disposed between the portions FP21 and FP22, and contacts with the via structure EB22 to receive the reference voltage signal VSS. The portion PF210 is disposed between the portions FP26 and FP27, and contacts with the via structure EB23 to receive the reference voltage signal VSS. The portion PF27 is disposed between the portions FP22 and FP23, and contacts with the via structure EB25 to receive the reference voltage signal VSS. The portion PF212 is disposed between the portions FP27 and FP28, and contacts with the via structure EB26 to receive the reference voltage signal VSS.

As illustratively shown in FIG. 2F, the conductive segment ME27 contacts with the via structure EB21 to receive the reference voltage signal VDD. The conductive segment ME26 contacts with the via structures EB24 and EB27 to receive the reference voltage signal VSS.

In some embodiments, each of the portions PF22, PF25, PF27, PF210, PF212 and other portions contacting with the via structure has a width WF21 along the Z-direction, and has the width WE21 along the X-direction. In some embodiments, the width WF21 is approximately equal to 10-100 nanometer. The width WE21 is approximately equal to 10-100 nanometer.

Referring to FIGS. 2D and 2F, the conductive segments ME26, ME27, ME28, ME21, ME22 and ME24 correspond to the conductive segments M211, M210, M26, M21, M25 and M28, respectively. The conductive segments ME29, ME25 and ME23 correspond to the conductive segments M27, M22-M24 and M29. In some embodiments, each of the portions PF21, PF23, PF24, PF26, PF28, PF29, PF211 and PF213 has the width WD28 along the X-direction. Each of the portions FP21-FP28 has the width WD29 along the X-direction. In some embodiments, the width WE21 is larger than the width WD28.

Figure 3A:
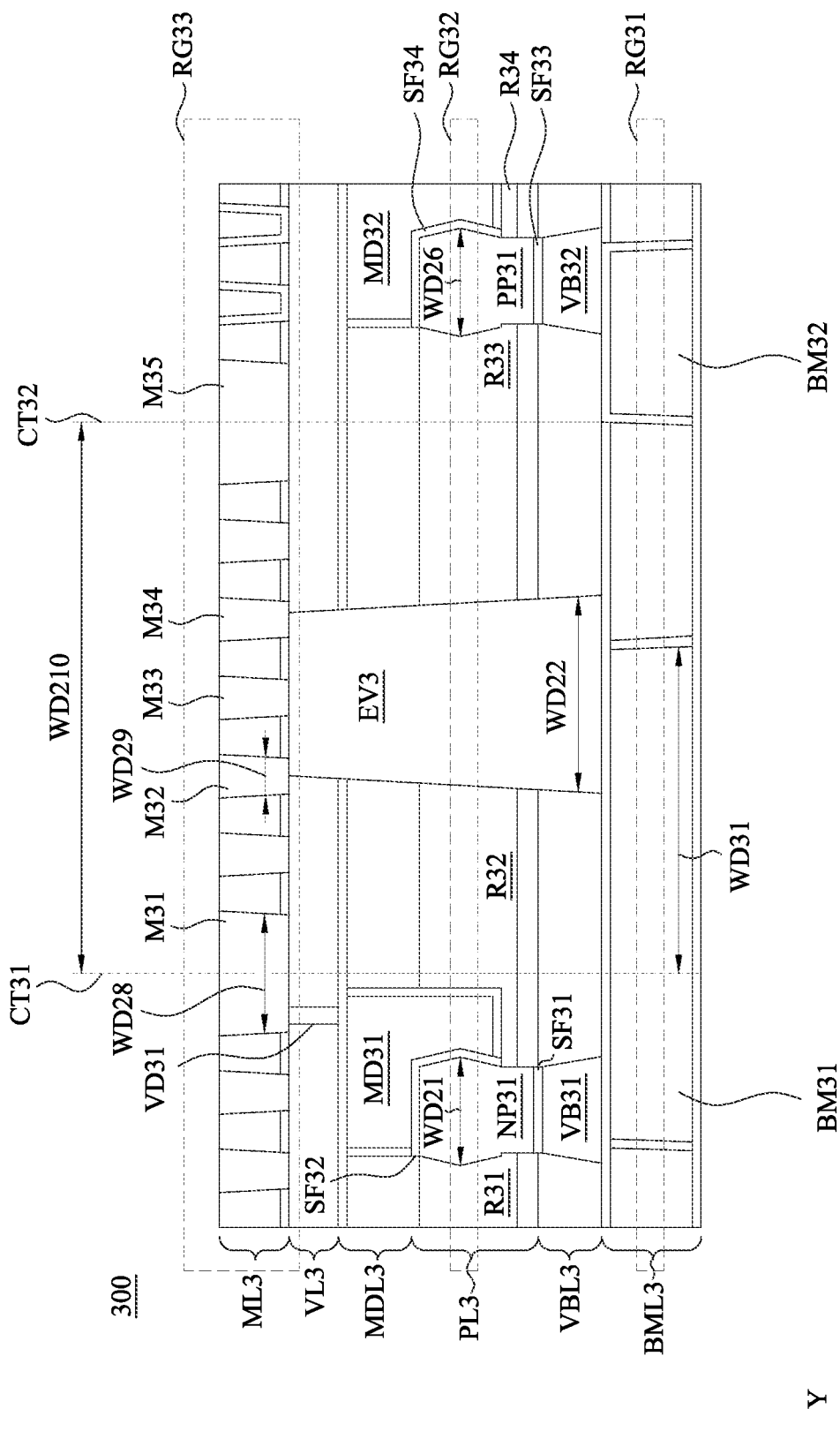
FIG. 3A is a cross section diagram of a semiconductor device corresponding to the semiconductor device shown in FIG. 1, in accordance with some embodiments of the present disclosure.

FIG. 3A is a cross section diagram of a semiconductor device 300 corresponding to the semiconductor device 100 shown in FIG. 1, in accordance with some embodiments of the present disclosure. As illustratively shown in FIG. 3A, the semiconductor device 300 includes regions RG31-RG33. Further details of the regions RG31-RG33 are described below with embodiments associated with the FIG. 3B to FIG. 3D. In the embodiment shown in FIG. 3A, the Z-direction points out from the paper.

In some embodiments, the semiconductor device 300 includes multiple layers. As illustratively shown in FIG. 3A, the semiconductor device 300 includes conductive layers BML3, ML3, MDL3, via layers VBL3, VL3, an epitaxial layer PL3 and a via structure EV3. The via structure EV3 is disposed through the conductive layer MDL3, the via layers VBL3, VL3 and the epitaxial layer PL3.

As illustratively shown in FIG. 3A, each of the conductive layers BML3, ML3, MDL3, the via layers VBL3, VL3, the epitaxial layer PL3 extends along the X-direction and the Z-direction. The conductive layer BML3, the via layer VBL3, the epitaxial layer PL3, the conductive layer MDL3, the via layer VL3 and the conductive layer ML3 are arranged in order along the Y-axis.

In some embodiments, the conductive layer BML3 includes conductive segments BM31 and BM32. The via layer VBL3 includes vias VB31 and VB32. The epitaxial layer PL3 includes epitaxial structures PP31, NP31 and isolation structures R31-R34. The epitaxial layer PL3 and the conductive layer MDL3 include conductive segments MD31 and MD32. The conductive layer ML3 includes conductive segments M31-M35. The via layer VL3 includes via VD31. In some embodiments, the semiconductor device 300 further includes films SF31-SF34.

Referring to FIG. 1 and FIG. 3A, the semiconductor device 300 is an alternative embodiment of the semiconductor device 100. The conductive layers BML3, ML3, MDL3, the via layers VBL3, VL3, the epitaxial layer PL3 and the via structure EV3 correspond to the conductive layers BML1, ML1, MDL1, the via layers VBL1, VL1, the epitaxial layer PL1 and the via structure EV1, respectively. The conductive segments vias VB31 and VB32 correspond to the via VB1. The epitaxial structures PP31, NP31 correspond to the epitaxial structure PP1. The films SF31 and SF33 correspond to the film SF11. The films SF32 and SF34 correspond to the film SF12. The isolation structures R31 and R34 correspond to the isolation structures R11. The isolation structures R32 and R33 correspond to the isolation structures R12. The conductive segments MD31 and MD32 correspond to the conductive segment MD1. The via VD31 correspond to the via VD1. Therefore, some descriptions are not repeated for brevity.

As illustratively shown in FIG. 3A, a first side of the via structure EV3 contacts with and is disposed above the conductive segment BM31. A second side of the via structure EV3 contacts with the conductive segments M32-M34. The conductive segments M31-M35 are arranged in the X-direction in order. In some embodiments, at least one of the conductive segments M32-M34 is coupled to the conductive segment M31 through a conductive segment crossing over the conductive segments M31-M35, such as a conductive segment MP31 shown in FIG. 3D.

As illustratively shown in FIG. 3A, the via VD31 contacts with and is disposed between the conductive segments M31 and MD31. The film SF32 contacts with and is disposed between the conductive segment MD31 and the epitaxial structure NP31. The film SF31 contacts with and is disposed between the via VB31 and the epitaxial structure NP31. The conductive segment BM31 contacts with the via VB31, and is configured to provide a reference voltage signal, such as a reference voltage signal VDD shown in FIG. 3B, to the epitaxial structure NP31 through the via VB31.

As illustratively shown in FIG. 3A, the isolation structure R31, the epitaxial structure NP31, the isolation structure R32, the via structure EV3, the isolation structure R33, the epitaxial structure PP31, the isolation structure R34 are arranged in order along the X-direction. In some embodiments, the epitaxial structures PP31 and NP31 are implemented by a p-type material and an n-type material, respectively.

As illustratively shown in FIG. 3A, along the X-direction, the epitaxial structure NP31, the via structure EV3, the epitaxial structure PP31, the conductive segments M31 and M32 have the widths WD21, WD22, WD26, WD28 and WD29, respectively. In some embodiments, the conductive segment M35 has the width WD28. Each of the conductive segments M33 and M34 has the width WD29.

As illustratively shown in FIG. 3A, an edge of the conductive segments BM31 is separated from a center CT31 of the conductive segment M31 along the X-direction by a width WD31. The center CT31 is separated from a center CT32 of the conductive segment M35 along the X-direction by the width WD210. In some embodiments, the width WD31 is approximately equal to 10-100 nanometer.

In some embodiments, the conductive segment BM31 is configured to provide the reference voltage signal, and the via structure EV3 is configured to transmit the reference voltage signal to the conductive segments M32-M34. The epitaxial structure NP31 is configured to receive the reference voltage signal from the via structure EV3 through at least one of the conductive segments M32-M34, the conductive segment M31 the via VD31 and the conductive segment MD31 in order, and is configured to operate according to the reference voltage signal.

Figure 3B:
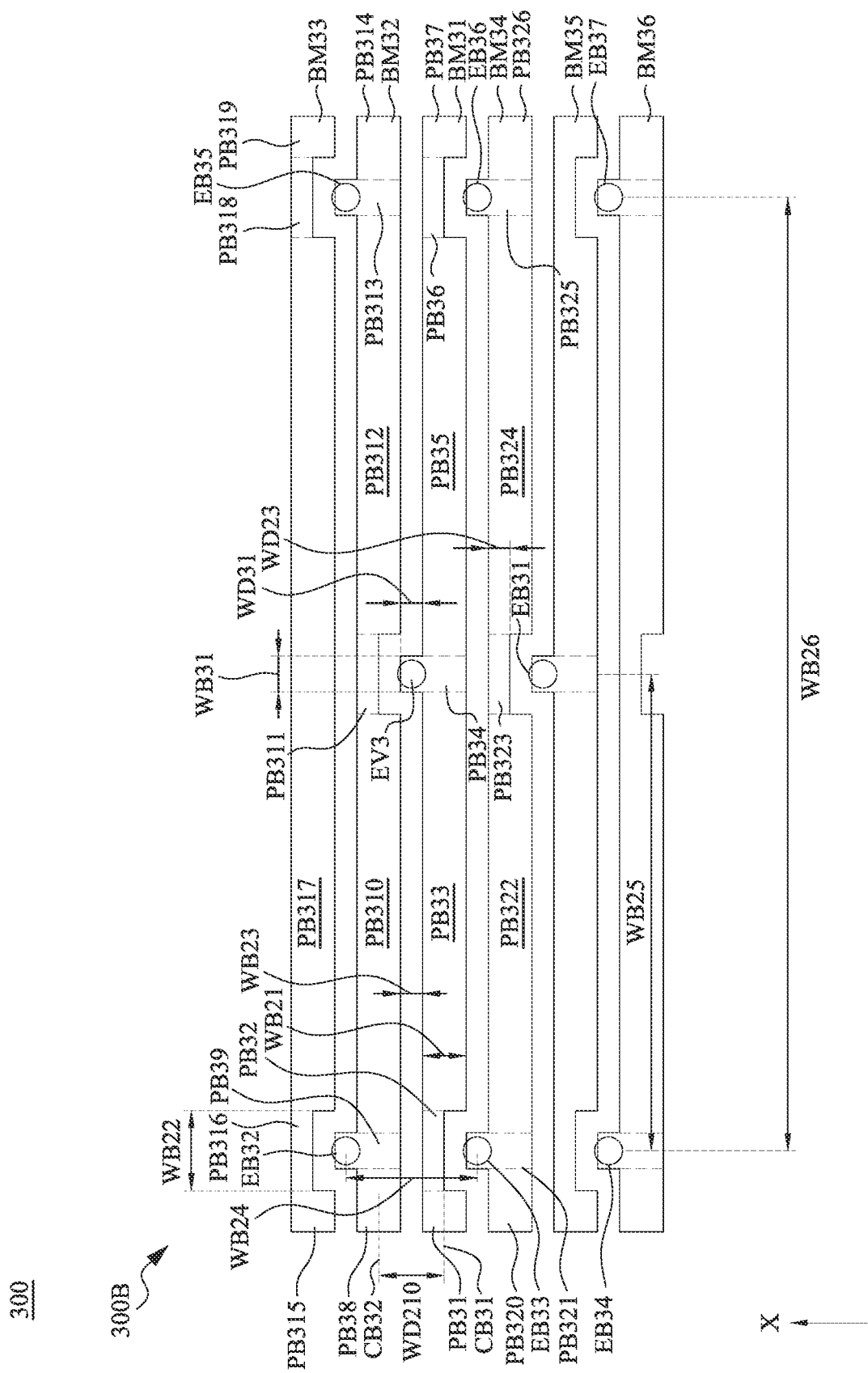
FIG. 3B is a layout diagram of a first region of the semiconductor device shown in FIG. 3A, in accordance with some embodiments of the present disclosure.

FIG. 3B is a layout diagram 300B of the region RG31 of the semiconductor device 300 shown in FIG. 3A, in accordance with some embodiments of the present disclosure. As illustratively shown in FIG. 3B, in the layout diagram 300B, the Y-direction points out from the paper.

In some embodiments, the semiconductor device 300 further includes via structures EB31-EB37 and conductive segments BM33-BM36. As illustratively shown in FIG. 3B, each of the conductive segments BM31-BM36 extends along the Z-direction.

Referring to FIG. 3A and FIG. 3B, each of the via structures EB31-EB37 is similar with the via structure EV3, is disposed through the conductive layer MDL3, the via layers VL3, VBL3 and the epitaxial layer PL3, and is configured to transmit one of the reference voltage signals VDD and VSS to the conductive layer ML3. Similar with the conductive segments BM31 and BM32, the conductive segments BM33-BM37 are also included in the conductive layer BML3.

As illustratively shown in FIG. 3B, the conductive segment BM31 includes portions PB31-PB37 arranged in order along the Z-direction. The conductive segment BM32 includes portions PB38-PB314 arranged in order along the Z-direction. The conductive segment BM33 includes portions PB315-PB319 arranged in order along the Z-direction.

The conductive segment BM34 includes portions PB320-PB326 arranged in order along the Z-direction.

In some embodiments, each of the portions PB31, PB33, PB35, PB37, PB38, PB310, PB312, PB314, PB315, PB317, PB319, PB320, PB322, PB324 and PB326 has the width WB21 along the X-direction. Each of portions PB32, PB36, PB311, PB316, PB318 and PB323 has the width WD23 along the X-direction, and has the width WB22 along the Z-direction. Each of portions PB34, PB39, PB313, PB321 and PB325 has the width WB21 plus the width WD31 along the X-direction, and has a width WB31 along the Z-direction. In some embodiments, the width WB31 is approximately equal to 10-100 nanometer.

In some embodiments, the portions PB31, PB33, PB35, PB37, PB38, PB310, PB312, PB314, PB315, PB317, PB319, PB320, PB322, PB324 and PB326 are referred to as longer portions, and the portions PB32, PB36, PB311, PB316, PB318 and PB323 are referred to as shorter portions. In some embodiments, along the X-direction, the portions PB34, PB39, PB313, PB321 and PB325 are longer than the longer portions to contact with the via structures, and are referred to as contacting portions.

In some embodiments, centers of adjacent two of the conductive segments BM31-BM36 are separated from each other along the X-direction by the width WD210. For example, as illustratively shown in FIG. 3B, a center CB31 of the conductive segment BM31 and a center CB32 of the conductive segment BM32 are separated from each other along the X-direction by the width WD210. In some embodiments, a center of the conductive segment BM33 and the center CB32 are separated from each other along the X-direction by the width WD210. A center of the conductive segment BM34 and the center CB31 are separated from each other along the X-direction by the width WD210.

In some embodiments, centers the conductive segments BM31-BM36 correspond to edges of the shorter portions. For example, the center CB31 corresponds to edges of the shorter portions PB32 and PB36. The center CB32 corresponds to an edge of the shorter portion PB311.

In some embodiments, longer portions of adjacent two of the conductive segments BM31-BM36 are separated from each other along the X-direction by the width WB23. For example, as illustratively shown in FIG. 3B, the longer portions PB33 and PB310 are separated from each other along the X-direction by the width WB23. For another example, the longer portions PB35 and PB312 are separated from each other along the X-direction by the width WB23.

As illustratively shown in FIG. 3B, the via structure EV3 contacts with and disposed above the portion PB34, is disposed between the portions PB33 and PB35 along the Z-direction, and is disposed between the portions PB310 and PB312 along the Z-direction. The via structure EB31 contacts with and disposed above a contacting portion of the conductive segment BM35, and is disposed between the portions PB322 and PB324 along the Z-direction.

As illustratively shown in FIG. 3B, the via structure EB32 contacts with and disposed above the portion PB39, is disposed between the portions PB315 and PB317 along the Z-direction, and is disposed between the portions PB38 and PB310 along the Z-direction. The via structure EB33 contacts with and disposed above the portion PB321, is disposed between the portions PB31 and PB33 along the Z-direction, and is disposed between the portions PB320 and PB322 along the Z-direction. The via structure EB34 contacts with and is disposed above a contacting portion of the conductive segment BM36.

As illustratively shown in FIG. 3B, the via structure EB35 contacts with and disposed above the portion PB313, is disposed between the portions PB317 and PB319 along the Z-direction, and is disposed between the portions PB312 and PB314 along the Z-direction. The via structure EB36 contacts with and disposed above the portion PB325, is disposed between the portions PB35 and PB37 along the Z-direction, and is disposed between the portions PB324 and PB326 along the Z-direction. The via structure EB37 contacts with and is disposed above a contacting portion of the conductive segment BM36.

As illustratively shown in FIG. 3B, along the X-direction, the via structures EB32-EB34 are aligned with each other, the via structures EB35-EB37 are aligned with each other, and the via structures EB31 and EV3 are aligned with each other. Along the Z-direction, the via structures EB32 and EB35 are aligned with each other, the via structures EB33 and EB36 are aligned with each other, and the via structures EB34 and EB37 are aligned with each other.

In some embodiments, along the X-direction, two aligned via structures are separated from each other by the width WB24. For example, as illustratively shown in FIG. 3B, the via structures EB32 and EB33 are separated from each other along the X-direction by the width WB24.

In some embodiments, along the Z-direction, two aligned via structures are separated from each other by the width WB26. For example, as illustratively shown in FIG. 3B, the via structures EB34 and EB37 are separated from each other along the Z-direction by the width WB26.

In some embodiments, along the Z-direction, two via structures disposed at two sides of one of the conductive segments BM31-BM36 are separated from each other by the width WB25. For example, as illustratively shown in FIG. 3B, the via structures EB34 and EB31, which are disposed at two sides of the conductive segment BM35, are separated from each other along the Z-direction by the width WB25. For another example, along the Z-direction, the via structure EV3 is separated from each one of the via structures EB32-EB37 by the width WB25.

In some embodiments, adjacent two of the conductive segments BM31-BM36 are configured to provide different reference voltage signal to corresponding conductive segments. As illustratively shown in FIG. 3B, the conductive segments BM31 and BM35 are configured to provide the reference voltage signal VDD to the via structures EV3, EB31, respectively. The conductive segment BM32 is configured to provide the reference voltage signal VSS to the via structures EB32 and EB35. The conductive segment BM34 is configured to provide the reference voltage signal VSS to the via structures EB33 and EB36. The conductive segment BM36 is configured to provide the reference voltage signal VSS to the via structures EB34 and EB37.

Figure 3C:
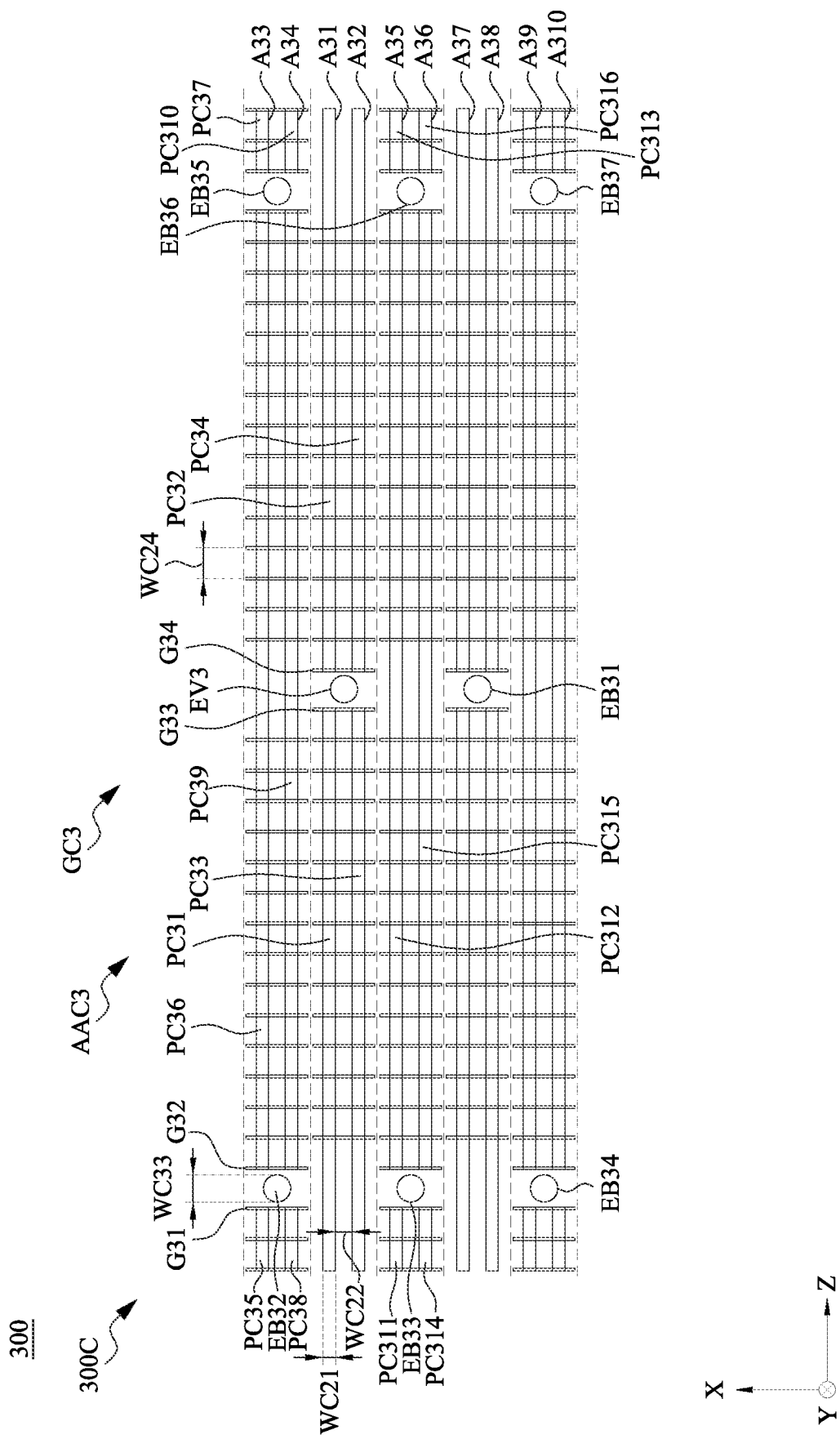
FIG. 3C is a layout diagram of a second region of the semiconductor device shown in FIG. 3A, in accordance with some embodiments of the present disclosure.

FIG. 3C is a layout diagram 300C of the region RG32 of the semiconductor device 300 shown in FIG. 3A, in accordance with some embodiments of the present disclosure. As illustratively shown in FIG. 3C, in the layout diagram 300C, the Y-direction points out from the paper.

In some embodiments, the semiconductor device 300 further includes active areas AAC3 and gate structures GC3. As illustratively shown in FIG. 3C, the active areas AAC3 extend along the Z-direction, and the gate structures GC3 extend along the Z-direction. The gate structures GC3 cross over corresponding ones of the active areas AAC3. In some embodiments, the active areas AAC3 and the gate structures GC3 forms multiple semiconductor elements, such as transistors. Referring to FIG. 3A and FIG. 3C, the active areas AAC3 and the gate structures GC3 are included in the epitaxial layer PL3.

In some embodiments, the active areas AAC3 includes active areas A31-A310. As illustratively shown in FIG. 3C, the active areas A310, A39, A38, A37, A36, A35, A32, A31, A34 and A33 are arranged in order along the X-direction. Each of the active areas A31-A310 has the width WC21 along the X-direction. Adjacent two of the active areas A31-A310 are separated from each other along the X-direction by the width WC22. The epitaxial structures NP31 and PP31 shown in FIG. 3A correspond to the active areas A35 and A34, respectively.

In some embodiments, each of the active areas A31-A310 includes multiple active area portions separated from each other along the Z-direction. As illustratively shown in FIG. 3C, the active area A31 includes portions PC31 and PC32 separated from each other and arranged in order along the Z-direction. The active area A32 includes portions PC33 and PC34 separated from each other and arranged in order along the Z-direction. The active area A33 includes portions PC35-PC37 separated from each other and arranged in order along the Z-direction. The active area A34 includes portions PC38-PC310 separated from each other and arranged in order along the Z-direction. The active area A35 includes portions PC311-PC313 separated from each other and arranged in order along the Z-direction. The active area A36 includes portions PC314-PC316 separated from each other and arranged in order along the Z-direction.

In some embodiments, the via structures EV3 and EB31-EB37 are disposed between portions of the active areas A31-A310. As illustratively shown in FIG. 3C, along the Z-direction, the via structure EV3 is disposed between the portions PC31 and PC32 and is disposed between the portions PC33 and PC34. The via structure EB32 is disposed between the portions PC35 and PC36 and is disposed between the portions PC38 and PC39. The via structure EB33 is disposed between the portions PC311 and PC312 and is disposed between the portions PC314 and PC315. The via structure EB35 is disposed between the portions PC36 and PC37 and is disposed between the portions PC39 and PC310. The via structure EB36 is disposed between the portions PC312 and PC313 and is disposed between the portions PC315 and PC316.

As illustratively shown in FIG. 3C, along the Z-direction, the via structure EB31 is disposed between the portions of the active areas A37 and A38. Each of the via structures EB34 and EB37 is disposed between the portions of the active areas A39 and A310.

In some embodiments, the gate structures GC3 includes gate structures G31-G34. Adjacent two of the gate structures GC3 are separated from each other along the Z-direction by the width WC24. As illustratively shown in FIG. 3C, the gate structures G31-G34 are arranged in order along the X-direction. The gate structure G31 is crossing over the portions PC35 and PC38. The gate structure G32 is crossing over the portions PC36 and PC39. The gate structure G33 is crossing over the portions PC31 and PC33. The gate structure G34 is crossing over the portions PC32 and PC34.

In some embodiments, each of the via structures EV3 and EB31-EB37 is disposed between two of gate structures GC3. As illustratively shown in FIG. 3C, the via structure EV3 is disposed between the gate structures G33 and G34. The via structure EB32 is disposed between the gate structures G31 and G32.

In some embodiments, each of the via structures EV3 and EB31-EB37 has the width WC23 along the Z-direction. The gate structures disposed at two sides of one of the via structures EV3 and EB31-EB37 are separated from each other along the Z-direction by the width WC23. For example, the gate structures G31 and G32 disposed at two sides of the via structure EB32 are separated from each other by the width WC23, and the gate structures G33 and G34 disposed at two sides of the via structure EV3 are separated from each other by the width WC23.

Figure 3D:
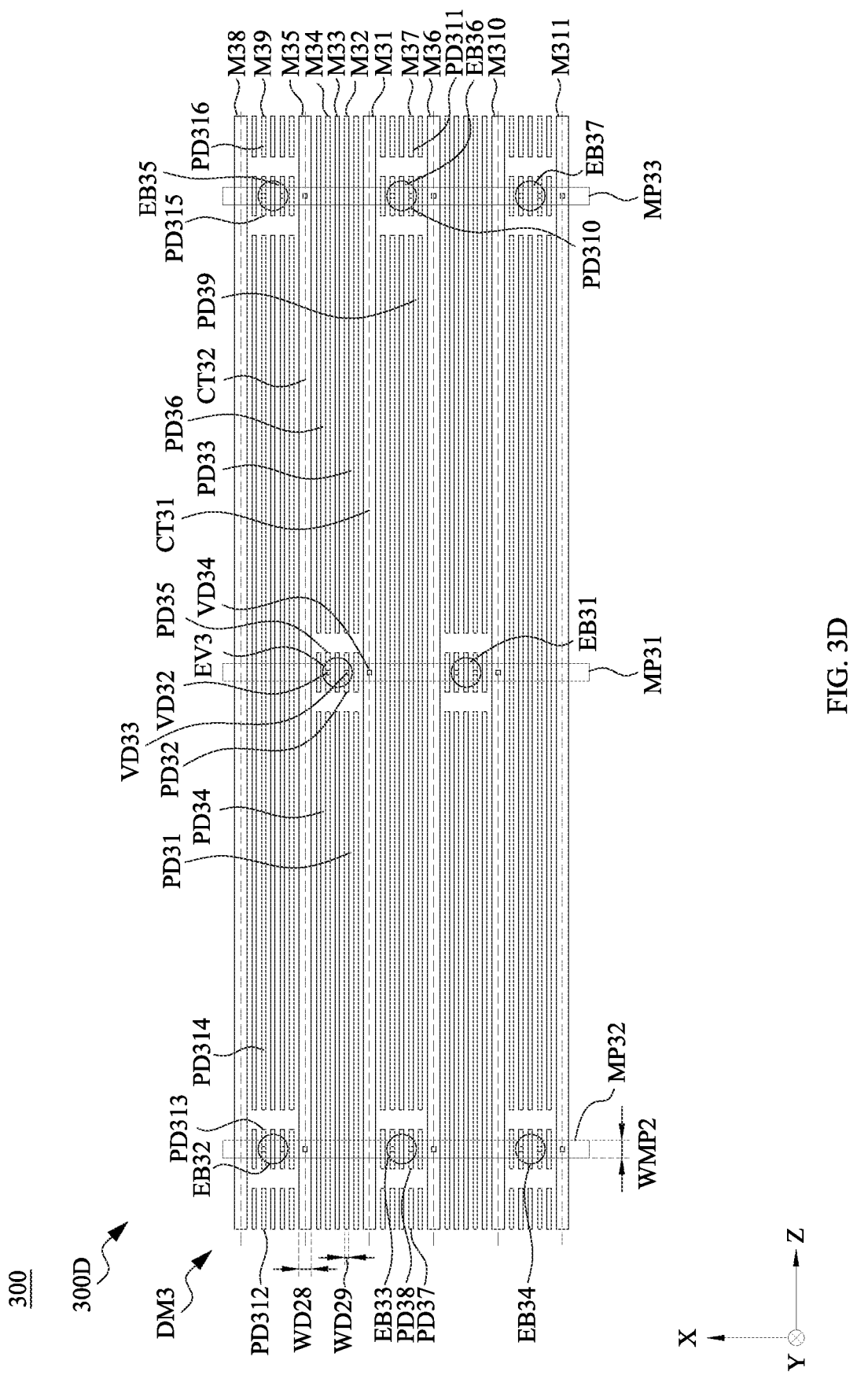
FIG. 3D is a layout diagram of a third region of the semiconductor device shown in FIG. 3A, in accordance with some embodiments of the present disclosure.

FIG. 3D is a layout diagram 300D of the region RG33 of the semiconductor device 300 shown in FIG. 3A, in accordance with some embodiments of the present disclosure. As illustratively shown in FIG. 3D, in the layout diagram 300D, the Y-direction points out from the paper.

In some embodiments, the semiconductor device 300 further includes conductive segments DM3, MP31-MP33 and vias VD32-VD34. The conductive segments DM3 includes conductive segments M31-M311. As illustratively shown in FIG. 3D, each of the conductive segments DM3 extends along the Z-direction. Each of the conductive segments MP31-MP33 extends along the X-direction and crosses over the conductive segments DM3. The conductive segments MP32, MP31 and MP33 are arranged in order along the Z-direction.

Referring to FIG. 3A and FIG. 3D, the conductive segments DM3 are included in the conductive layer ML3. The conductive segments MP31-MP33 are included in a conductive layer (not shown in figures) disposed above the conductive layer ML3. The vias VD32-VD34 are disposed between the conductive layer of the conductive segments MP31-MP33 and the conductive layer ML3.

As illustratively shown in FIG. 3D, the conductive segments M311, M310, M36, M37, M31-M35, M39 and M38 are arranged in order along the X-direction. The conductive segment M32 includes portions PD31-PD33. The conductive segment M34 includes portions PD34-PD36. The conductive segment M37 includes portions PD37-PD311. The conductive segment M39 includes portions PD312-PD316.

As illustratively shown in FIG. 3D, along the X-direction, the portions PD31-PD33 are arranged in order, the portions PD34-PD36 are arranged in order, the portions PD37-PD311 are arranged in order, and the portions PD312-PD316 are arranged in order. The portions PD31-PD316 are separated from each other.

As illustratively shown in FIG. 3D, the conductive segment MP31 crosses over the portions PD32, PD35, PD39 and PD314. The conductive segment MP32 crosses over the portions PD31, PD34, PD313 and PD38. The conductive segment MP33 crosses over the portions PD33, PD36, PD315 and PD310.

In some embodiments, one of the conductive segments MP31-MP33 is coupled to corresponding via structures and conductive segments through vias and portions. For example, the conductive segment MP31 is coupled to the via structure EV3 through vias VD32, VD33 and portions PD32 and PD35, is coupled to the via structure EB31 through corresponding portions and vias, is coupled to the conductive segment M31 through a via VD34, and is coupled to the conductive segment M310 through a corresponding via.

For another example, the conductive segment MP32 is coupled to the via structure EB32 through portion PD313, is coupled to the via structure EB33 through the portion PD38, is coupled to the via structure EB34 through corresponding portions, and is coupled to the conductive segments M311, M36 and M35 through corresponding vias.

For further example, the conductive segment MP33 is coupled to the via structure EB35 through portion PD315, is coupled to the via structure EB36 through the portion PD310, is coupled to the via structure EB37 through corresponding portions, and is coupled to the conductive segments M311, M36 and M35 through corresponding vias.

In some embodiments, the conductive segments DM3 correspond to signal tracks and power rails. Some of the conductive segments DM3 correspond to the signal tracks and are configured to receive reference voltage signals from the via structures EV3 and EB31-EB37. Some of the conductive segments DM3 correspond to the power rails and are configured to receive reference voltage signals from the conductive segments MP31-MP33.

In the embodiment shown in FIG. 3D, the conductive segments M31, M35, M36, M38, M310 and M311 correspond to the power rails, and the conductive segments M32-M34, M37 and M39 correspond to the signal tracks. The portions PD32 and PD34 are configured to receive the reference voltage signal VDD from the via structure EV3, and transmit the reference voltage signal VDD to the conductive segment MP31. The portions coupled to the via structure EB31 is configured to transmit the reference voltage signal VDD from the via structure EB31 to the conductive segment MP31. The conductive segments M31 and M310 are configured to receive the reference voltage signal VDD from the conductive segment MP31.

In the embodiment shown in FIG. 3D, the portion PD313 is configured to receive the reference voltage signal VSS from the via structure EB32, and transmit the reference voltage signal VSS to the conductive segment MP32. The portion PD38 is configured to receive the reference voltage signal VSS from the via structure EB33, and transmit the reference voltage signal VSS to the conductive segment MP32. The portions coupled to the via structure EB34 is configured to transmit the reference voltage signal VSS to the conductive segment MP32. The conductive segments M35, M36 and M311 are configured to receive the reference voltage signal VSS from the conductive segment MP32.

In the embodiment shown in FIG. 3D, the portion PD315 is configured to receive the reference voltage signal VSS from the via structure EB35, and transmit the reference voltage signal VSS to the conductive segment MP33. The portion PD310 is configured to receive the reference voltage signal VSS from the via structure EB36, and transmit the reference voltage signal VSS to the conductive segment MP33. The portions coupled to the via structure EB37 is configured to transmit the reference voltage signal VSS to the conductive segment MP33. The conductive segments M35, M36 and M311 are also configured to receive the reference voltage signal VSS from the conductive segment MP33.

In some embodiments, along the X-direction, each of the conductive segments corresponding to the signal tracks has the width WD29, and each of the conductive segments corresponding to the power rails has the width WD28. For example, each of the conductive segments M32-M34, M37 and M39 has the width WD29, and each of the conductive segments M31, M35, M36, M38, M310 and M311 has the width WD28. In some embodiments, each of the conductive segments MP31-MP33 has the width WMP2 along the Z-direction.

In the embodiment shown in FIG. 3D, five conductive segments corresponding to the signal tracks are disposed between two conductive segments corresponding to the power rails. For example, the conductive segments M32-M34 and other two conductive segments are disposed between the conductive segments M31 and M35. In various embodiment, various numbers of conductive segments corresponding to the signal tracks, such as three to eight conductive segments, are disposed between two conductive segments corresponding to the power rails.

Figure 3E:
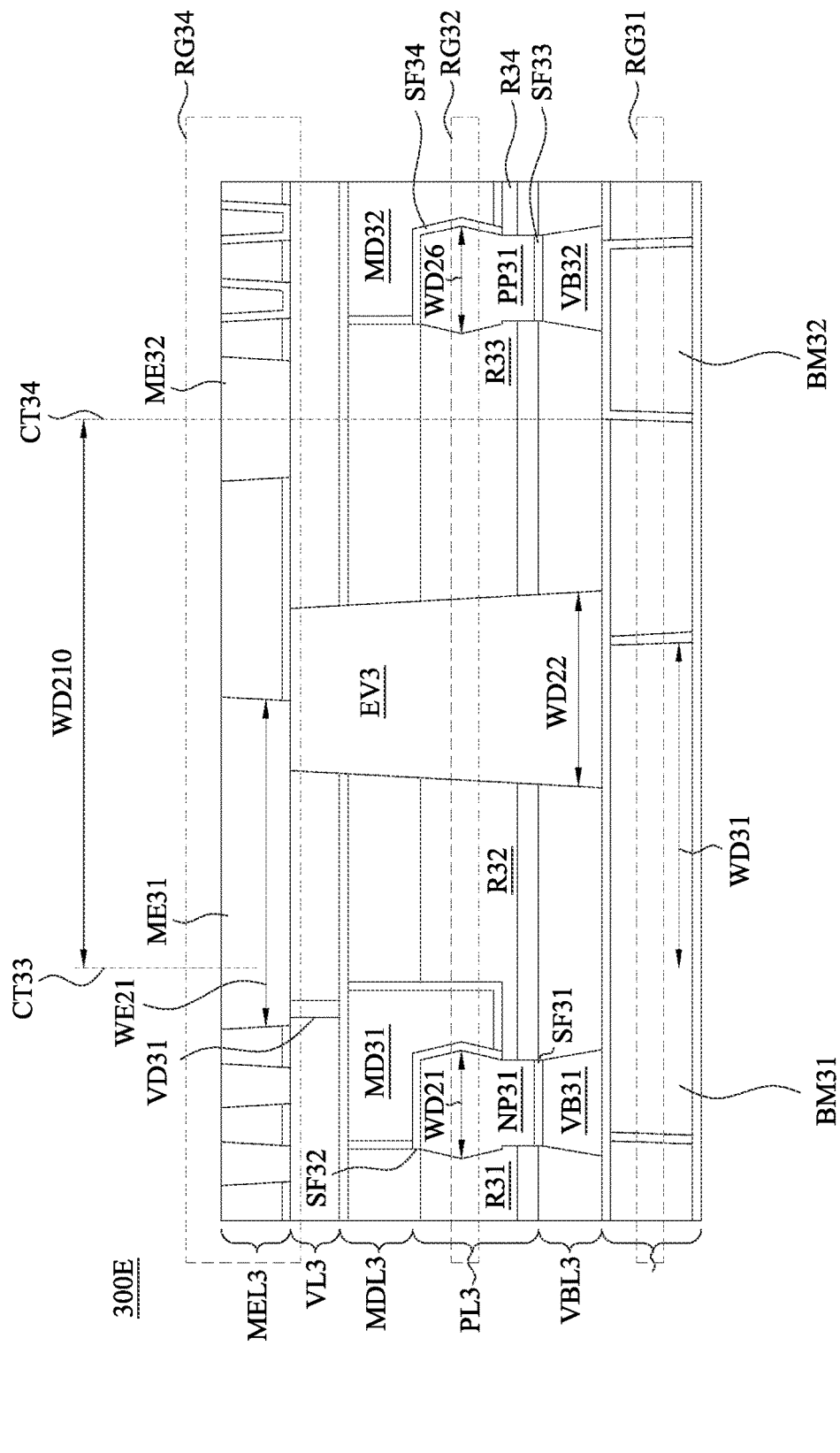
FIG. 3E is a cross section diagram of a semiconductor device corresponding to the semiconductor device shown in FIG. 1, in accordance with some embodiments of the present disclosure.

FIG. 3E is a cross section diagram of a semiconductor device 300E corresponding to the semiconductor device 100 shown in FIG. 1, in accordance with some embodiments of the present disclosure. In the embodiment shown in FIG. 3E, the Z-direction points out from the paper.

Referring to FIG. 3E and FIG. 3A, the semiconductor device 300E is an alternative embodiment of the semiconductor device 300A. FIG. 3E follows a similar labeling convention to that of FIG. 3A. For brevity, the discussion will focus more on differences between FIG. 3A and FIG. 3E than on similarities.

Referring to FIG. 3E and FIG. 3A, instead of the conductive layer ML3, the semiconductor device 300E includes a conductive layer MEL3. The conductive layer MEL3 is disposed above and contacts with the via layer VL3. A region RG34 of the semiconductor device 300E corresponds to the conductive layer MEL3.

In some embodiments, the conductive layer MEL3 includes conductive segments ME31 and ME32 arranged in order along the X-direction. As illustratively shown in FIG. 3E, along the X-direction, a center CT33 of the conductive segment ME31 is separated from a center CT34 of the conductive segment ME32 by the width WD210, the conductive segment ME31 has the width WE21, and the center CT33 is separated from the edge of the conductive segment BM31 by the width WD31.

In some embodiments, the conductive segment ME31 contacts with the via structure EV3 and the via VD31, and configured to transmit a reference voltage signal from the via structure EV3 to the via VD31.

Figure 3F:
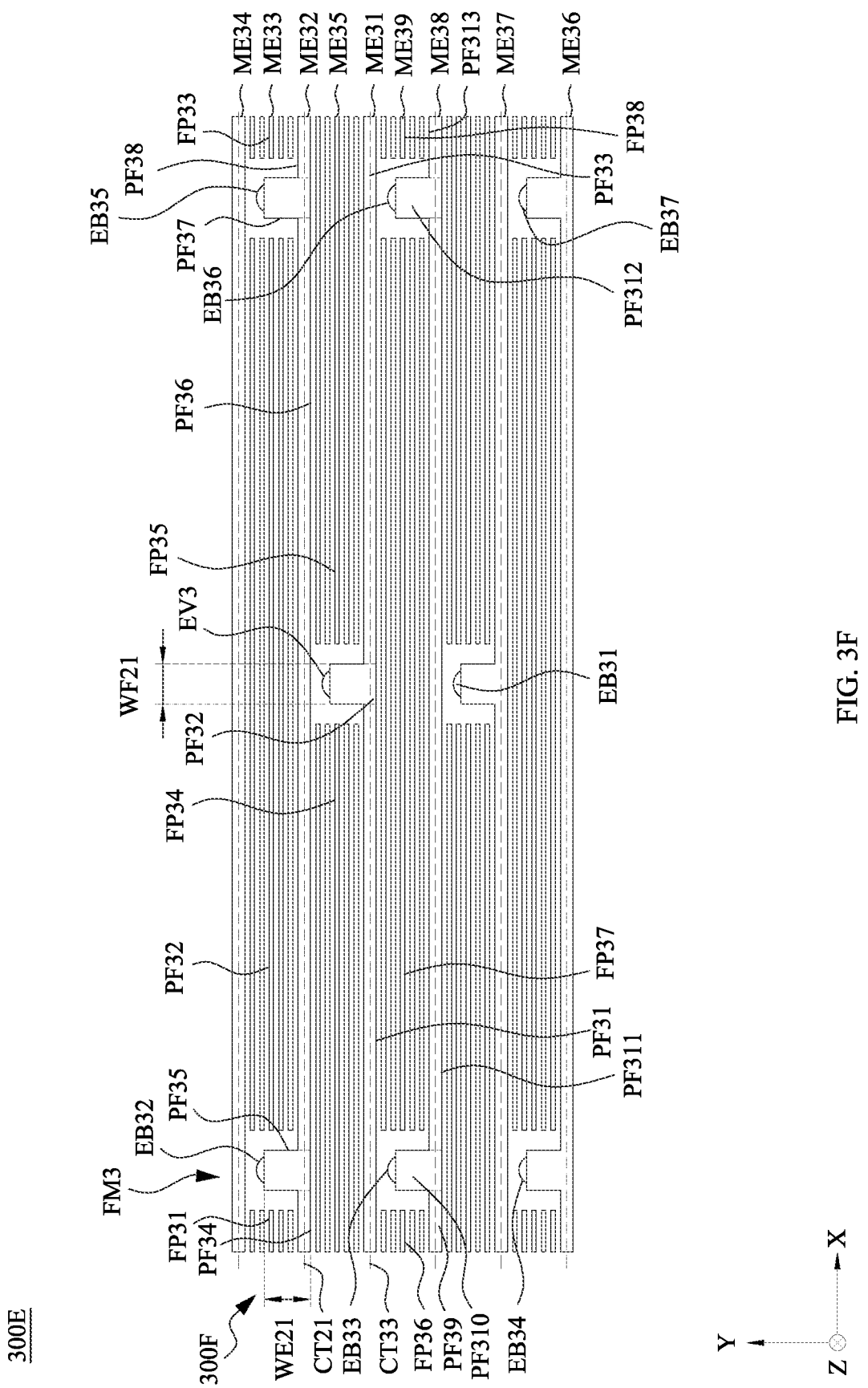
FIG. 3F is a layout diagram of a region of the semiconductor device shown in FIG. 3E, in accordance with some embodiments of the present disclosure.

FIG. 3F is a layout diagram 300F of the region RG34 of the semiconductor device 300E shown in FIG. 3E, in accordance with some embodiments of the present disclosure. As illustratively shown in FIG. 3F, in the layout diagram 300F, the Y-direction points out from the paper.

In some embodiments, the semiconductor device 300 further includes conductive segments FM3. The conductive segments FM3 includes conductive segments ME31-ME39. As illustratively shown in FIG. 3F, each of the conductive segments FM3 extends along the Z-direction. Referring to FIG. 3E and FIG. 3F, the conductive segments FM3 are included in the conductive layer MEL3.

As illustratively shown in FIG. 3F, the conductive segments ME36-ME39, ME31, ME35 and ME32-ME34 are arranged in order along the X-direction. The conductive segment ME31 includes portions PF31-PF33 arranged in order along the Z-direction. The conductive segment ME32 includes portions PF34-PF38 arranged in order along the Z-direction. The conductive segment ME38 includes portions PF39-PF313 arranged in order along the Z-direction.

As illustratively shown in FIG. 3F, the conductive segment ME33 includes portions FP31-FP33 arranged in order along the Z-direction. The conductive segment ME35 includes portions PF34-PF35 arranged in order along the Z-direction. The conductive segment ME39 includes portions PF36-PF38 arranged in order along the Z-direction. The portions PF31-PF38 are separated from each other.

As illustratively shown in FIG. 3F, the portion PF32 is disposed between the portions FP34 and FP35, and contacts with the via structure EV3 to receive the reference voltage signal VDD. The portion PF35 is disposed between the portions FP31 and FP32, and contacts with the via structure EB32 to receive the reference voltage signal VSS. The portion PF310 is disposed between the portions FP36 and FP37, and contacts with the via structure EB33 to receive the reference voltage signal VSS. The portion PF37 is disposed between the portions FP32 and FP33, and contacts with the via structure EB35 to receive the reference voltage signal VSS. The portion PF312 is disposed between the portions FP37 and FP38, and contacts with the via structure EB36 to receive the reference voltage signal VSS.

As illustratively shown in FIG. 3F, the conductive segment ME37 contacts with the via structure EB31 to receive the reference voltage signal VDD. The conductive segment ME36 contacts with the via structures EB34 and EB37 to receive the reference voltage signal VSS. In some embodiments, each of the portions PF32, PF35, PF37, PF310, PF312 and other portions contacting with the via structure has the width WF21 along the Z-direction, and has the width WE21 along the X-direction.

Referring to FIGS. 3D and 3F, the conductive segments ME36, ME37, ME38, ME31, ME32 and ME34 correspond to the conductive segments M311, M310, M36, M31, M35 and M38, respectively. The conductive segments ME39, ME35 and ME33 correspond to the conductive segments M37, M32-M34 and M39. In some embodiments, each of the portions PF31, PF33, PF34, PF36, PF38, PF39, PF311 and PF313 has the width WD28 along the X-direction. Each of the portions FP31-FP38 has the width WD29 along the X-direction. In some embodiments, the width WE21 is larger than the width WD28.

Figure 4A:
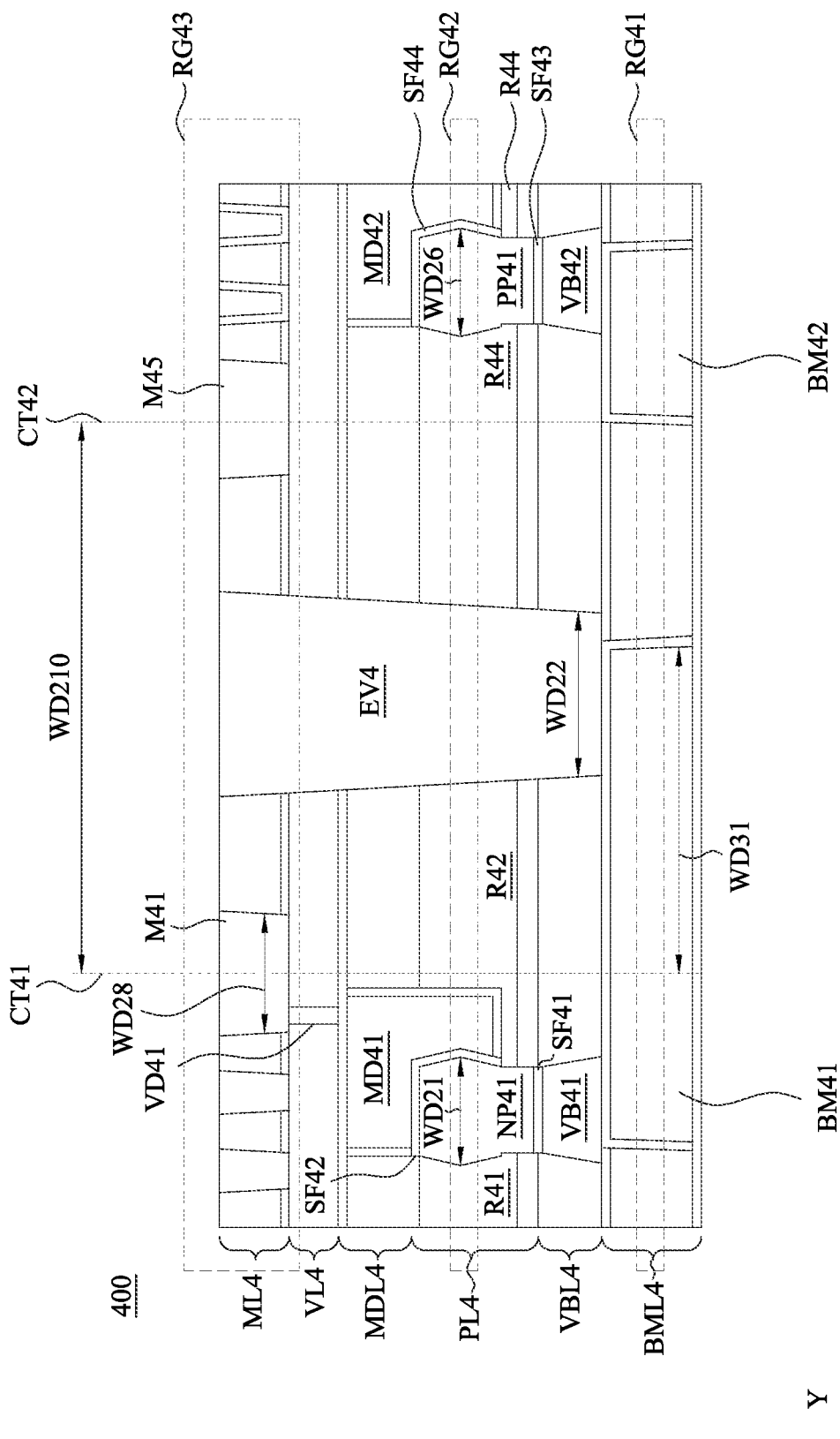
FIG. 4A is a cross section diagram of a semiconductor device corresponding to the semiconductor device shown in FIG. 1, in accordance with some embodiments of the present disclosure.

FIG. 4A is a cross section diagram of a semiconductor device 400 corresponding to the semiconductor device 100 shown in FIG. 1, in accordance with some embodiments of the present disclosure. As illustratively shown in FIG. 4A, the semiconductor device 400 includes regions RG41-RG43. Further details of the regions RG41-RG43 are described below with embodiments associated with the FIG. 4B to FIG. 4D. In the embodiment shown in FIG. 4A, the Z-direction points out from the paper.

In some embodiments, the semiconductor device 400 includes multiple layers. As illustratively shown in FIG. 4A, the semiconductor device 400 includes conductive layers BML4, ML4, MDL4, via layers VBL4, VL4, an epitaxial layer PL4 and a via structure EV4. The via structure EV4 is disposed through the conductive layers ML4, MDL4, the via layers VBL4, VL4, the epitaxial layer PL4.

As illustratively shown in FIG. 4A, each of the conductive layers BML4, ML4, MDL4, the via layers VBL4, VL4, the epitaxial layer PL4 extends along the X-direction and the Z-direction. The conductive layer BML4, the via layer VBL4, the epitaxial layer PL4, the conductive layer MDL4, the via layer VL4 and the conductive layer ML4 are arranged in order along the Y-axis.

In some embodiments, the conductive layer BML4 includes conductive segments BM41 and BM42. The via layer VBL4 includes vias VB41 and VB42. The epitaxial layer PL4 includes epitaxial structures PP41, NP41 and isolation structures R41-R44. The epitaxial layer PL4 and the conductive layer MDL4 include conductive segments MD41 and MD42. The conductive layer ML4 includes conductive segments M41 and M45. The via layer VL4 includes via VD41. In some embodiments, the semiconductor device 400 further includes films SF41-SF44.

Referring to FIG. 1 and FIG. 4A, the semiconductor device 400 is an alternative embodiment of the semiconductor device 100. The conductive layers BML4, ML4, MDL4, the via layers VBL4, VL4, the epitaxial layer PL4 and the via structure EV4 correspond to the conductive layers BML1, ML1, MDL1, the via layers VBL1, VL1, the epitaxial layer PL1 and the via structure EV1, respectively. The conductive segments vias VB41 and VB42 correspond to the via VB1. The epitaxial structures PP41, NP41 correspond to the epitaxial structure PP1. The films SF41 and SF43 correspond to the film SF11. The films SF42 and SF44 correspond to the film SF12. The isolation structures R41 and R44 correspond to the isolation structures R11. The isolation structures R42 and R43 correspond to the isolation structures R12. The conductive segments MD41 and MD42 correspond to the conductive segment MD1. The via VD41 correspond to the via VD1. Therefore, some descriptions are not repeated for brevity.

As illustratively shown in FIG. 4A, a first side of the via structure EV4 contacts with and is disposed above the conductive segment BM41. A second side of the via structure EV4 contacts with a conductive segment disposed above the conductive layer ML4, such as a conductive segment MP41 shown in FIG. 4D. The conductive segments M41 and M45 are arranged in the X-direction in order. In some embodiments, the conductive segment M41 is also contacts with the conductive segment disposed above the conductive layer ML4.

As illustratively shown in FIG. 4A, the via VD41 contacts with and is disposed between the conductive segments M41 and MD41. The film SF42 contacts with and is disposed between the conductive segment MD41 and the epitaxial structure NP41. The film SF41 contacts with and is disposed between the via VB41 and the epitaxial structure NP41. The conductive segment BM41 contacts with the via VB41, and is configured to provide a reference voltage signal, such as a reference voltage signal VDD shown in FIG. 4B, to the epitaxial structure NP41 through the via VB41.

As illustratively shown in FIG. 4A, the isolation structure R41, the epitaxial structure NP41, the isolation structure R42, the via structure EV4, the isolation structure R43, the epitaxial structure PP41, the isolation structure R44 are arranged in order along the X-direction. In some embodiments, the epitaxial structures PP41 and NP41 are implemented by a p-type material and an n-type material, respectively.

As illustratively shown in FIG. 4A, along the X-direction, the epitaxial structure NP41, the via structure EV4, the conductive segment BM41, the epitaxial structure PP41 and the conductive segment M41 have the widths WD21, WD22, WD24, WD26 and WD28, respectively. In some embodiments, the conductive segment M45 also has the width WD28.

As illustratively shown in FIG. 4A, an edge of the conductive segments BM41 is separated from a center CT41 of the conductive segment M41 along the X-direction by the width WD31. The center CT41 is separated from a center CT42 of the conductive segment M45 along the X-direction by the width WD210.

Figure 4B:
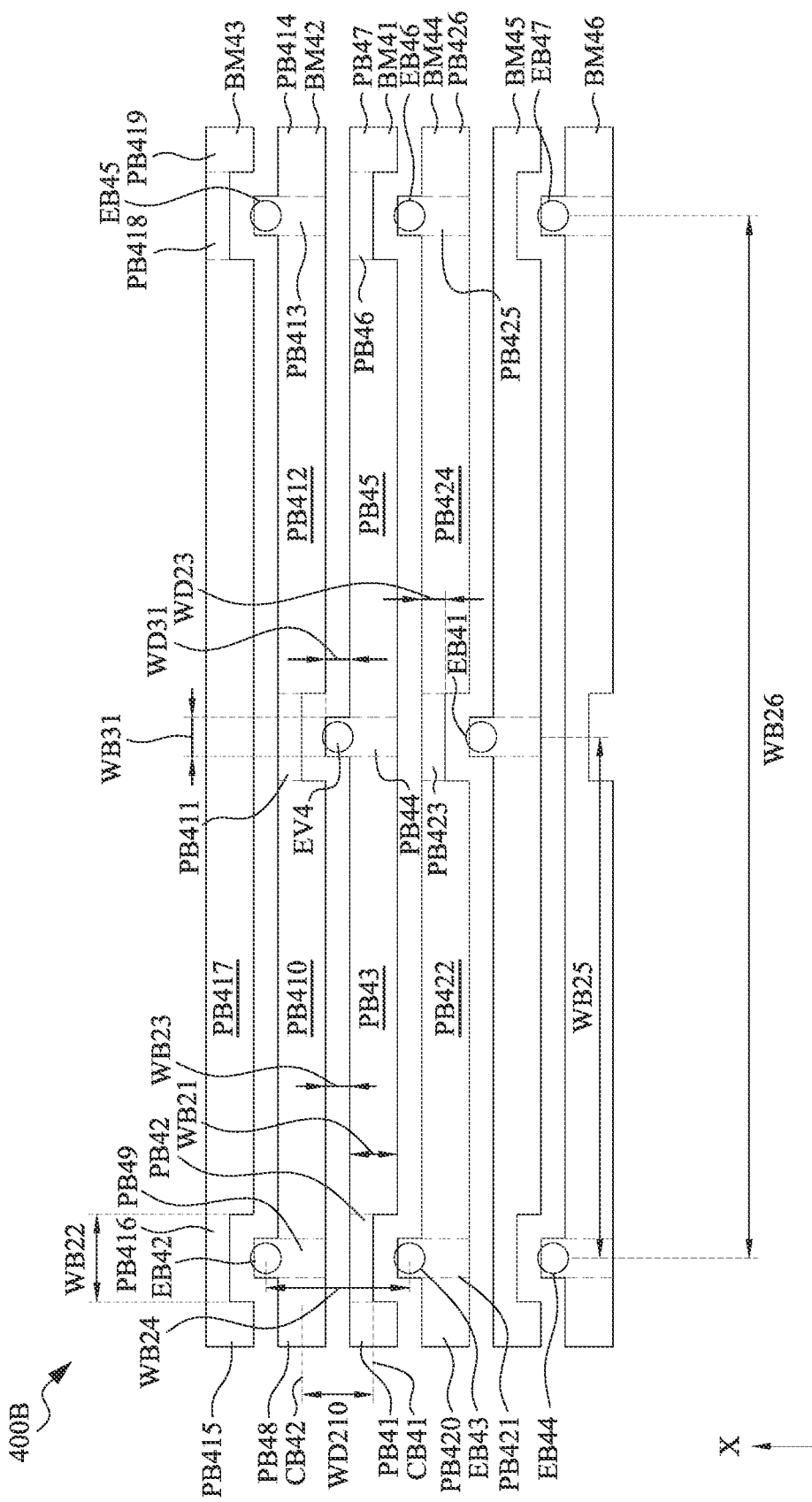
FIG. 4B is a layout diagram of a first region of the semiconductor device shown in FIG. 4A, in accordance with some embodiments of the present disclosure.
Figure 4C:
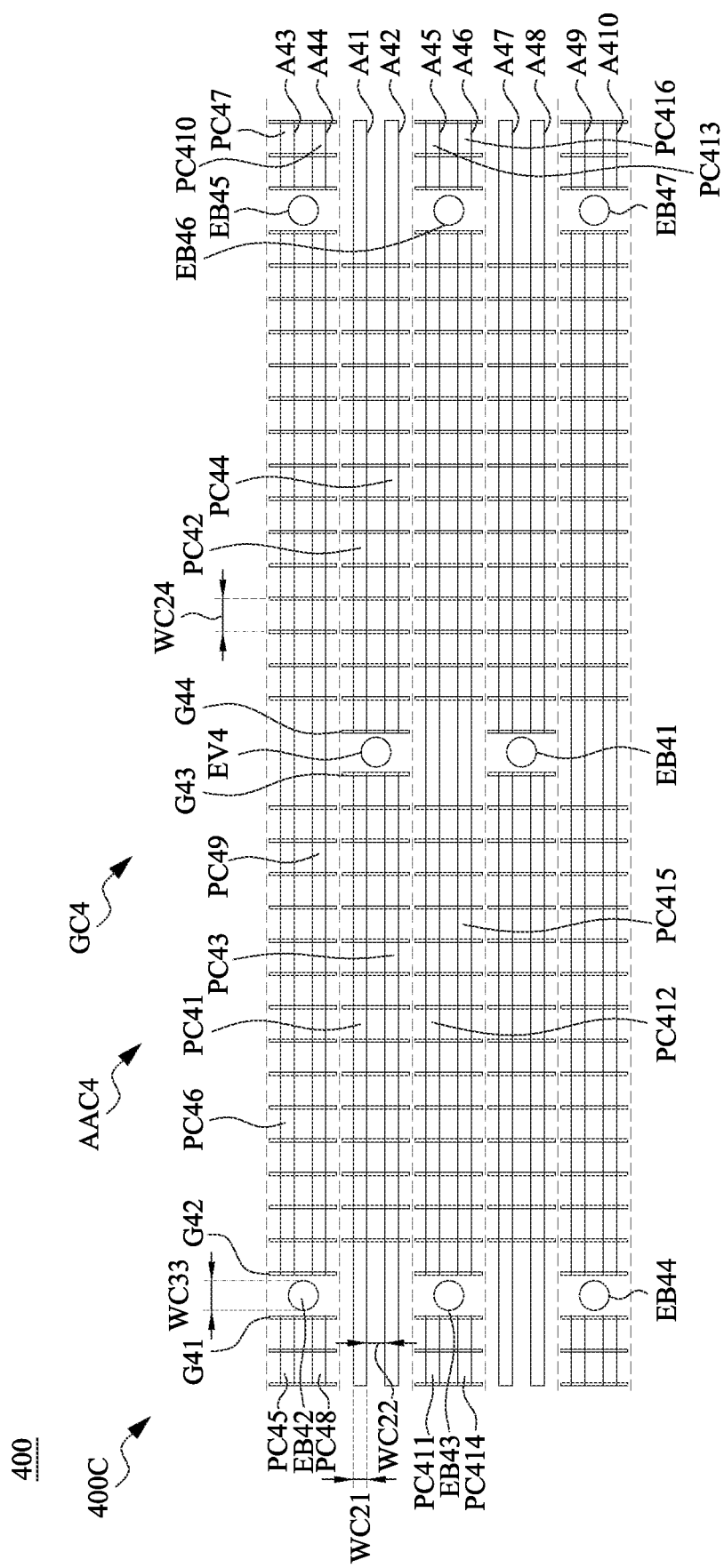
FIG. 4C is a layout diagram of a second region of the semiconductor device shown in FIG. 4A, in accordance with some embodiments of the present disclosure.
Figure 4D:
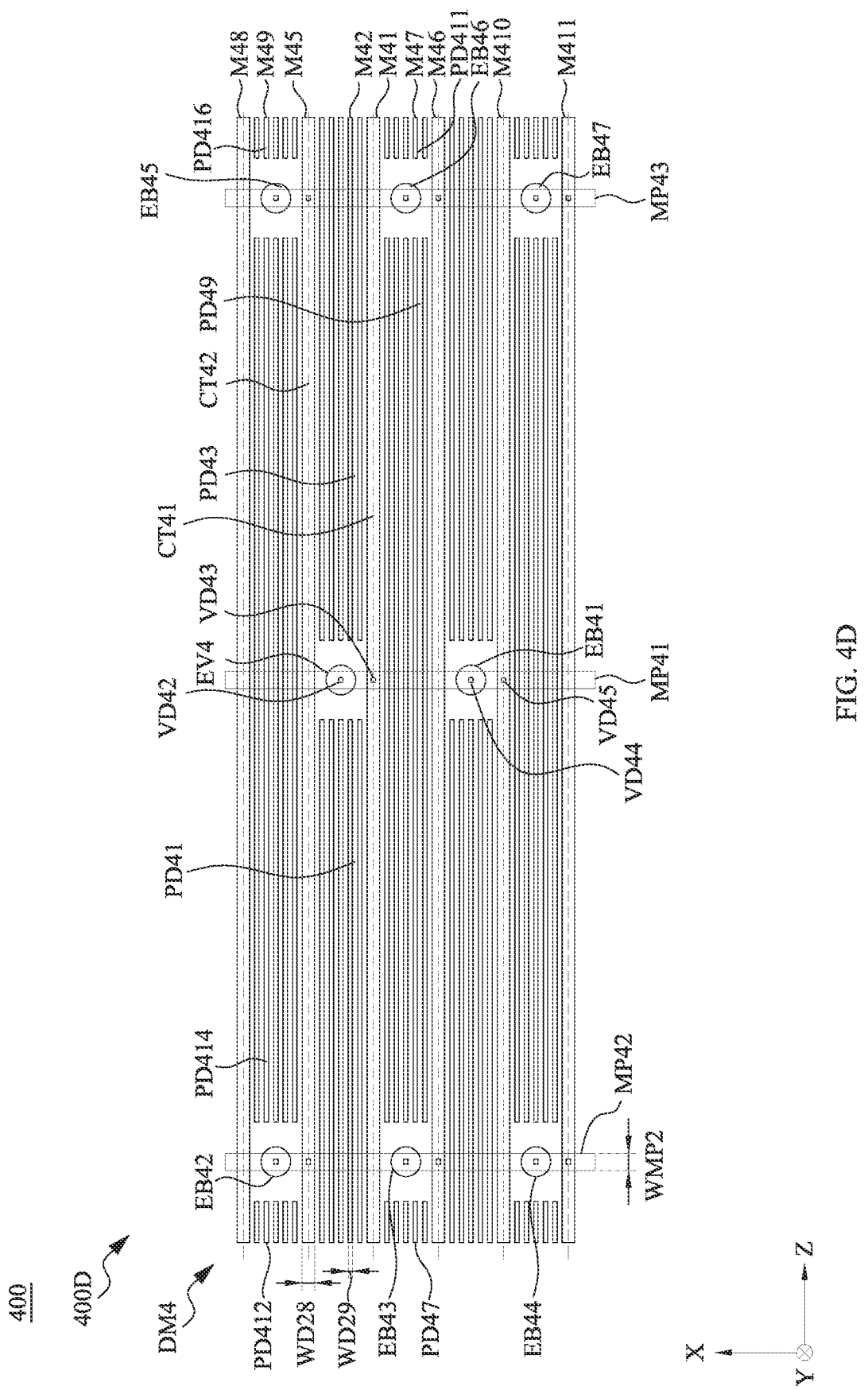
FIG. 4D is a layout diagram of a third region of the semiconductor device shown in FIG. 4A, in accordance with some embodiments of the present disclosure.

In some embodiments, the conductive segment BM41 is configured to provide the reference voltage signal, and the via structure EV4 is configured to transmit the reference voltage signal to the conductive segment MP41 shown in FIG. 4D. The epitaxial structure NP41 is configured to receive the reference voltage signal from the via structure EV4 through the conductive segment MP41, the conductive segment M41 the via VD41 and the conductive segment MD41 in order, and is configured to operate according to the reference voltage signal.

FIG. 4B is a layout diagram 400B of the region RG41 of the semiconductor device 400 shown in FIG. 4A, in accordance with some embodiments of the present disclosure. As illustratively shown in FIG. 4B, in the layout diagram 400B, the Y-direction points out from the paper.

In some embodiments, the semiconductor device 400 further includes via structures EB41-EB47 and conductive segments BM43-BM46. As illustratively shown in FIG. 4B, each of the conductive segments BM41-BM46 extends along the Z-direction.

Referring to FIG. 4A and FIG. 4B, each of the via structures EB41-EB47 is similar with the via structure EV4, is disposed through the conductive layers ML4, MDL4, the via layers VL4, VBL4 and the epitaxial layer PL4, and is configured to transmit one of reference voltage signals VDD and VSS to a conductive segment disposed above the conductive layer ML4. Similar with the conductive segments BM41 and BM42, the conductive segments BM43-BM47 are also included in the conductive layer BML4.

As illustratively shown in FIG. 4B, the conductive segment BM41 includes portions PB41-PB47 arranged in order along the Z-direction. The conductive segment BM42 includes portions PB48-PB414 arranged in order along the Z-direction. The conductive segment BM43 includes portions PB415-PB419 arranged in order along the Z-direction. The conductive segment BM44 includes portions PB420-PB426 arranged in order along the Z-direction.

In some embodiments, each of the portions PB41, PB43, PB45, PB47, PB48, PB410, PB412, PB414, PB415, PB417, PB419, PB420, PB422, PB424 and PB426 has the width WB21 along the X-direction. Each of portions PB42, PB46, PB411, PB416, PB418 and PB423 has the width WD24 along the X-direction, and has the width WB22 along the Z-direction. Each of portions PB44, PB49, PB413, PB421 and PB425 has the width WB21 plus the width WD31 along the X-direction, and has the width WB31 along the Z-direction.

In some embodiments, the portions PB41, PB43, PB45, PB47, PB48, PB410, PB412, PB414, PB415, PB417, PB419, PB420, PB422, PB424 and PB426 are referred to as longer portions, and the portions PB42, PB46, PB411, PB416, PB418 and PB423 are referred to as shorter portions. In some embodiments, along the X-direction, the portions PB44, PB49, PB413, PB421 and PB425 are longer than the longer portions to contact with the via structures, and are referred to as contacting portions.

In some embodiments, centers of adjacent two of the conductive segments BM41-BM46 are separated from each other along the X-direction by the width WD210. For example, as illustratively shown in FIG. 4B, a center CB41 of the conductive segment BM41 and a center CB42 of the conductive segment BM42 are separated from each other along the X-direction by the width WD210. In some embodiments, a center of the conductive segment BM43 and the center CB42 are separated from each other along the X-direction by the width WD210. A center of the conductive segment BM44 and the center CB41 are separated from each other along the X-direction by the width WD210.

In some embodiments, centers the conductive segments BM41-BM46 correspond to edges of the shorter portions. For example, the center CB41 corresponds to edges of the shorter portions PB42 and PB46. The center CB42 corresponds to an edge of the shorter portion PB411.

In some embodiments, longer portions of adjacent two of the conductive segments BM41-BM46 are separated from each other along the X-direction by the width WB23. For example, as illustratively shown in FIG. 4B, the longer portions PB43 and PB410 are separated from each other along the X-direction by the width WB23. For another example, the longer portions PB45 and PB412 are separated from each other along the X-direction by the width WB23.

As illustratively shown in FIG. 4B, the via structure EV4 contacts with and disposed above the portion PB44, is disposed between the portions PB43 and PB45 along the Z-direction, and is disposed between the portions PB410 and PB412 along the Z-direction. The via structure EB41 contacts with and disposed above a contacting portion of the conductive segment BM45, and is disposed between the portions PB422 and PB424 along the Z-direction.

As illustratively shown in FIG. 4B, the via structure EB42 contacts with and disposed above the portion PB49, is disposed between the portions PB415 and PB417 along the Z-direction, and is disposed between the portions PB48 and PB410 along the Z-direction. The via structure EB43 contacts with and disposed above the portion PB421, is disposed between the portions PB41 and PB43 along the Z-direction, and is disposed between the portions PB420 and PB422 along the Z-direction. The via structure EB44 contacts with and is disposed above a contacting portion of the conductive segment BM46.

As illustratively shown in FIG. 4B, the via structure EB45 contacts with and disposed above the portion PB413, is disposed between the portions PB417 and PB419 along the Z-direction, and is disposed between the portions PB412 and PB414 along the Z-direction. The via structure EB46 contacts with and disposed above the portion PB425, is disposed between the portions PB45 and PB47 along the Z-direction, and is disposed between the portions PB424 and PB426 along the Z-direction. The via structure EB47 contacts with and is disposed above a contacting portion of the conductive segment BM46.

As illustratively shown in FIG. 4B, along the X-direction, the via structures EB42-EB44 are aligned with each other, the via structures EB45-EB47 are aligned with each other, and the via structures EB41 and EV4 are aligned with each other. Along the Z-direction, the via structures EB42 and EB45 are aligned with each other, the via structures EB43 and EB46 are aligned with each other, and the via structures EB44 and EB47 are aligned with each other.

In some embodiments, along the X-direction, two aligned via structures are separated from each other by the width WB24. For example, as illustratively shown in FIG. 4B, the via structures EB42 and EB43 are separated from each other along the X-direction by the width WB24.

In some embodiments, along the Z-direction, two aligned via structures are separated from each other by the width WB26. For example, as illustratively shown in FIG. 4B, the via structures EB44 and EB47 are separated from each other along the Z-direction by the width WB26.

In some embodiments, along the Z-direction, two via structures disposed at two sides of one of the conductive segments BM41-BM46 are separated from each other by the width WB25. For example, as illustratively shown in FIG. 4B, the via structures EB44 and EB41, which are disposed at two sides of the conductive segment BM45, are separated from each other along the Z-direction by the width WB25. For another example, along the Z-direction, the via structure EV4 is separated from each one of the via structures EB42-EB47 by the width WB25.

In some embodiments, adjacent two of the conductive segments BM41-BM46 are configured to provide different reference voltage signal to corresponding conductive segments. As illustratively shown in FIG. 4B, the conductive segments BM41 and BM45 are configured to provide the reference voltage signal VDD to the via structures EV4, EB41, respectively. The conductive segment BM42 is configured to provide the reference voltage signal VSS to the via structures EB42 and EB45. The conductive segment BM44 is configured to provide the reference voltage signal VSS to the via structures EB43 and EB46. The conductive segment BM46 is configured to provide the reference voltage signal VSS to the via structures EB44 and EB47.

FIG. 4C is a layout diagram 400C of the region RG42 of the semiconductor device 400 shown in FIG. 4A, in accordance with some embodiments of the present disclosure. As illustratively shown in FIG. 4C, in the layout diagram 400C, the Y-direction points out from the paper.

In some embodiments, the semiconductor device 400 further includes active areas AAC4 and gate structures GC4. As illustratively shown in FIG. 4C, the active areas AAC4 extend along the Z-direction, and the gate structures GC4 extend along the Z-direction. The gate structures GC4 cross over corresponding ones of the active areas AAC4. In some embodiments, the active areas AAC4 and the gate structures GC4 forms multiple semiconductor elements, such as transistors. Referring to FIG. 4A and FIG. 4C, the active areas AAC4 and the gate structures GC4 are included in the epitaxial layer PL4.

In some embodiments, the active areas AAC4 includes active areas A41-A410. As illustratively shown in FIG. 4C, the active areas A410, A49, A48, A47, A46, A45, A42, A41, A44 and A43 are arranged in order along the X-direction. Each of the active areas A41-A410 has the width WC21 along the X-direction. Adjacent two of the active areas A41-A410 are separated from each other along the X-direction by a width WC22. The epitaxial structures NP41 and PP41 shown in FIG. 4A correspond to the active areas A45 and A44, respectively.

In some embodiments, each of the active areas A41-A410 includes multiple active area portions separated from each other along the Z-direction. As illustratively shown in FIG. 4C, the active area A41 includes portions PC41 and PC42 separated from each other and arranged in order along the Z-direction. The active area A42 includes portions PC43 and PC44 separated from each other and arranged in order along the Z-direction. The active area A43 includes portions PC45-PC47 separated from each other and arranged in order along the Z-direction. The active area A44 includes portions PC48-PC410 separated from each other and arranged in order along the Z-direction. The active area A45 includes portions PC411-PC413 separated from each other and arranged in order along the Z-direction. The active area A46 includes portions PC414-PC416 separated from each other and arranged in order along the Z-direction.

In some embodiments, the via structures EV4 and EB41-EB47 are disposed between portions of the active areas A41-A410. As illustratively shown in FIG. 4C, along the Z-direction, the via structure EV4 is disposed between the portions PC41 and PC42 and is disposed between the portions PC43 and PC44. The via structure EB42 is disposed between the portions PC45 and PC46 and is disposed between the portions PC48 and PC49. The via structure EB43 is disposed between the portions PC411 and PC412 and is disposed between the portions PC414 and PC415. The via structure EB45 is disposed between the portions PC46 and PC47 and is disposed between the portions PC49 and PC410. The via structure EB46 is disposed between the portions PC412 and PC413 and is disposed between the portions PC415 and PC416.

As illustratively shown in FIG. 4C, along the Z-direction, the via structure EB41 is disposed between the portions of the active areas A47 and A48. Each of the via structures EB44 and EB47 is disposed between the portions of the active areas A49 and A410.

In some embodiments, the gate structures GC4 includes gate structures G41-G44. Adjacent two of the gate structures GC4 are separated from each other along the Z-direction by the width WC24. As illustratively shown in FIG. 4C, the gate structures G41-G44 are arranged in order along the X-direction. The gate structure G41 is crossing over the portions PC45 and PC48. The gate structure G42 is crossing over the portions PC46 and PC49. The gate structure G43 is crossing over the portions PC41 and PC43. The gate structure G44 is crossing over the portions PC42 and PC44.

In some embodiments, each of the via structures EV4 and EB41-EB47 is disposed between two of gate structures GC4. As illustratively shown in FIG. 4C, the via structure EV4 is disposed between the gate structures G43 and G44. The via structure EB42 is disposed between the gate structures G41 and G42.

In some embodiments, each of the via structures EV4 and EB41-EB47 has the width WC23 along the Z-direction. The gate structures disposed at two sides of one of the via structures EV4 and EB41-EB47 are separated from each other along the Z-direction by the width WC23. For example, the gate structures G41 and G42 disposed at two sides of the via structure EB42 are separated from each other by the width WC23, and the gate structures G43 and G44 disposed at two sides of the via structure EV4 are separated from each other by the width WC23.

FIG. 4D is a layout diagram 400D of the region RG44 of the semiconductor device 400 shown in FIG. 4A, in accordance with some embodiments of the present disclosure. As illustratively shown in FIG. 4D, in the layout diagram 400D, the Y-direction points out from the paper.

In some embodiments, the semiconductor device 400 further includes conductive segments DM4, MP41-MP43 and vias VD42-VD45. The conductive segments DM4 includes conductive segments M41, M42 and M45-M411. As illustratively shown in FIG. 4D, each of the conductive segments DM4 extends along the Z-direction. Each of the conductive segments MP41-MP43 extends along the X-direction and crosses over the conductive segments M41, M45, M48, M46, M410 and M411. The conductive segments MP42, MP41 and MP43 are arranged in order along the Z-direction.

Referring to FIG. 4A and FIG. 4D, the conductive segments DM4 are included in the conductive layer ML4. The conductive segments MP41-MP44 are included in a conductive layer (not shown in figures) disposed above the conductive layer ML4. The vias VD42-VD45 are disposed between the conductive layer of the conductive segments MP41-MP43 and the conductive layer ML4.

As illustratively shown in FIG. 4D, the conductive segments M411, M410, M46, M47, M41, M42, M45, M49 and M48 are arranged in order along the X-direction. The conductive segment M42 includes portions PD41 and PD42. The conductive segment M47 includes portions PD47, PD49 and PD411. The conductive segment M49 includes portions PD412, PD414 and PD416.

As illustratively shown in FIG. 4D, along the X-direction, the portions PD41 and PD42 are arranged in order, the portions PD47, PD49 and PD411 are arranged in order, and the portions PD412, PD414 and PD416 are arranged in order. The portions PD41, PD42, PD47, PD49, PD411, PD412, PD414 and PD416 are separated from each other.

In some embodiments, one of the conductive segments MP41-MP43 is coupled to corresponding via structures and conductive segments through vias. For example, the conductive segment MP41 is coupled to the via structures EV4, EB41 and the conductive segments M41, M410 through vias VD42, VD44, VD43 and VD45, respectively.

For another example, the conductive segment MP42 is coupled to the via structures EB42-EB44 and the conductive segments M411, M46 and M45 through corresponding vias. The conductive segment MP43 is coupled to the via structures EB45-EB47 and the conductive segments M411, M46 and M45 through corresponding vias.

In the embodiment shown in FIG. 4D, the conductive segments M41, M45, M46, M48, M410 and M411 correspond to the power rails. Each of the via structures EV4 and EB41 is configured to transmit the reference voltage signal VDD through the conductive segment MP41 to the conductive segments M41 and M410. Each of the via structures EB42-EB44 is configured to transmit the reference voltage signal VSS through the conductive segment MP42 to the conductive segments M411, M46 and M45. Each of the via structures EB45-EB47 is configured to transmit the reference voltage signal VSS through the conductive segment MP43 to the conductive segments M411, M46 and M45.

In some embodiments, along the X-direction, each of the conductive segments M42, M47 and M49 has the width WD29, and each of the conductive segments M41, M45, M46, M48, M410 and M411 has the width WD28. In some embodiments, each of the conductive segments MP41-MP43 has the width WMP2 along the Z-direction.

Figure 5:
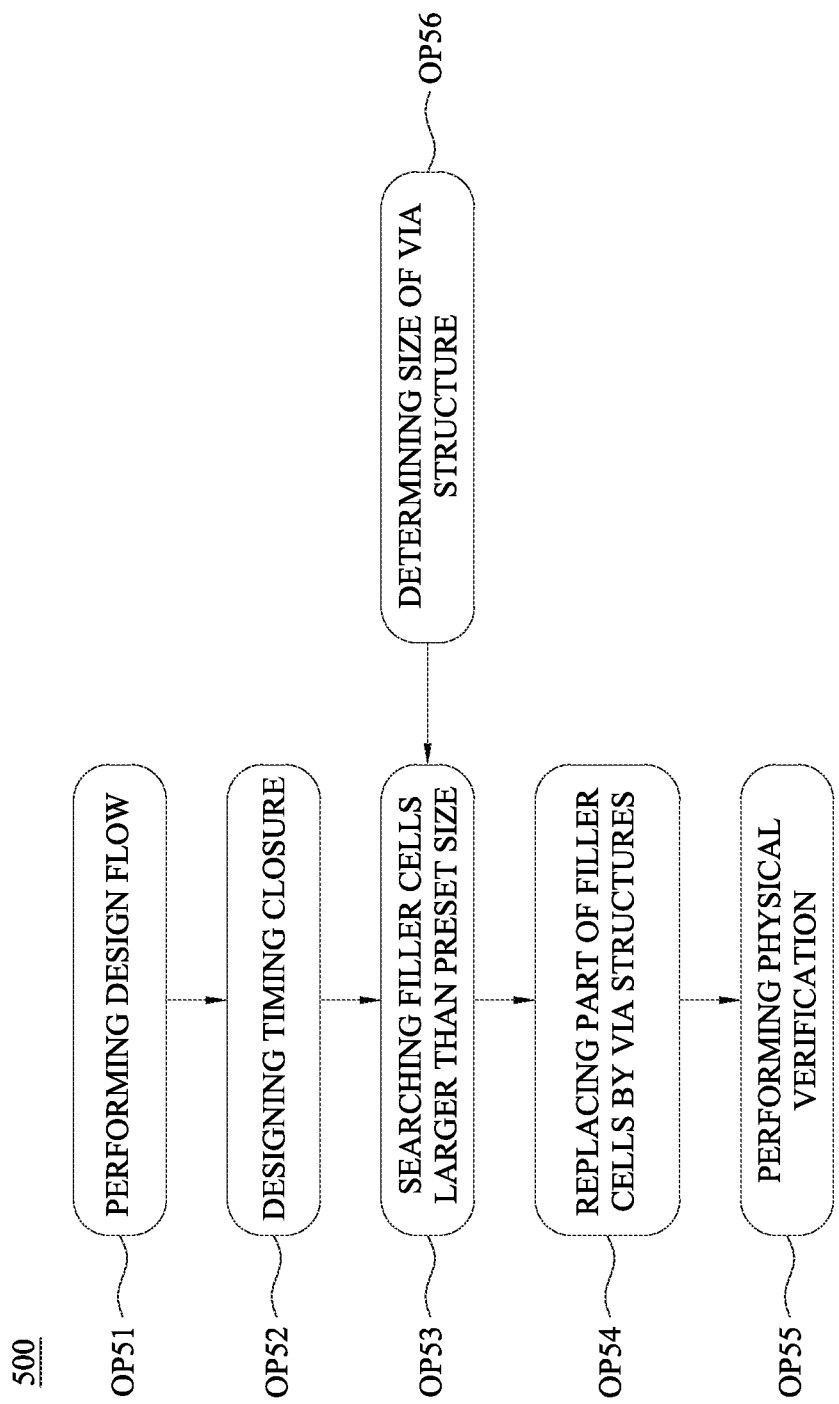
FIG. 5 is a flowchart of a method, associated with the semiconductor device shown in FIG. 3E, in accordance with some embodiments of the present disclosure.

FIG. 5 is a flowchart of a method 500, associated with the semiconductor device 300E shown in FIG. 3E, in accordance with some embodiments of the present disclosure. As illustratively shown in FIG. 5, the method 500 includes operations OP51-OP56. In some embodiments, the operations OP51-OP55 are performed in order. In some embodiments, at least a part of the method 500 is performed to form the semiconductor device 300E shown in FIG. 3E. In some embodiments, the method 500 is performed by a processor.

At the operation OP51, a design flow of a semiconductor device is performed. At the operation OP52, time closure of the semiconductor device is designed. At the operation OP53, filler cells larger than or equal to a preset size are searched in the semiconductor device. In some embodiments, the preset size is equal to four contact poly pitches (CPP). In some embodiments, the filler cells are configured to fill gaps between the semiconductor elements, such as transistors formed by the active areas AAC3 and the gate structures GC3 shown in FIG. 3C.

In some embodiments, the operation OP56 is performed when the operation OP53 is performed. At the operation OP56, different sizes of via structures are determined according to different sizes of the filler cells. At the operation OP54, in response to a size of one of the filler cells being larger than or equal to the preset size, a part of the one of the filler cells is remove to be replaced by one of the via structures. Alternatively, stated, a via structure is formed at a position of the part of the one of the filler cells. At the operation OP57, physical verifications, such as layout versus schematic (LVS) and design rule check (DRC), are performed to the semiconductor device.

Figure 6:
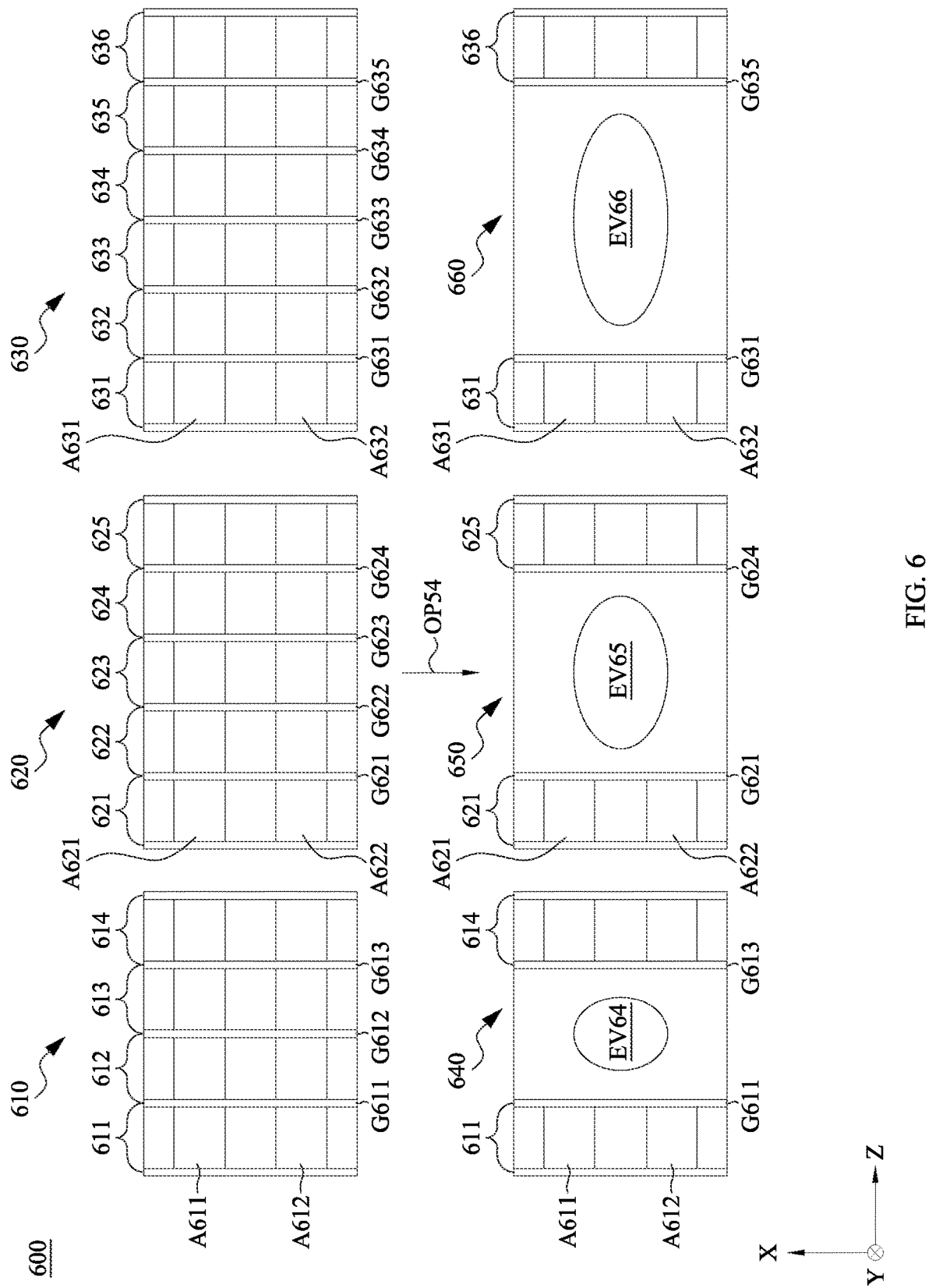
FIG. 6 is a schematic diagram of an operation of the method shown in FIG. 5, in accordance with some embodiments of the present disclosure.

FIG. 6 is a schematic diagram 600 of the operation OP54 of the method 500 shown in FIG. 5, in accordance with some embodiments of the present disclosure. As illustratively shown in FIG. 6, the schematic diagram 600 illustrates filler cells 610, 620, 630, 640, 650 and 660. In some embodiments, the operation OP54 is performed to transform the filler cells 610, 620 and 630 into the filler cells 640, 650 and 660, respectively.

In some embodiments, the filler cell 610 includes active areas A611, A612 and gate structures G611-G613, and is divided into portions 611-614. As illustratively shown in FIG. 6, each of the gate structures G611-G613 crosses over the active areas A611 and A612. The gate structure G611 is disposed at a boundary of the portions 611 and 612. The gate structure G612 is disposed at a boundary of the portions 612 and 613. The gate structure G613 is disposed at a boundary of the portions 613 and 614.

In some embodiments, each of the portions 611-614 corresponds to one CPP. The filler cell 610 has a size of four CPP, and is searched during the operation OP53. At the operation OP54, the portions 612-613 are removed. Alternatively stated, the gate structure G612 and parts of the active area between the gate structures G611 and G613 are removed. A via structure EV64 is formed at a position of the portions 612-613, to form the filler cell 640.

As illustratively shown in FIG. 6, the filler cell 640 includes the via structure EV64 disposed between the gate structures G611 and G613. In some embodiments, a width of the via structure EV64 is approximately equal to two CPP.

In some embodiments, the filler cell 620 includes active areas A621, A622 and gate structures G621-G624, and is divided into portions 621-625. As illustratively shown in FIG. 6, each of the gate structures G621-G624 crosses over the active areas A621 and A622. The gate structure G621 is disposed at a boundary of the portions 621 and 622. The gate structure G622 is disposed at a boundary of the portions 622 and 623. The gate structure G623 is disposed at a boundary of the portions 623 and 624. The gate structure G624 is disposed at a boundary of the portions 624 and 625.

In some embodiments, each of the portions 621-625 corresponds to one CPP. The filler cell 620 has a size of five CPP, and is searched during the operation OP53. At the operation OP54, the portions 622-624 are removed. Alternatively stated, the gate structures G622, G623 and parts of the active area between the gate structures G621 and G624 are removed. A via structure EV65 is formed at a position of the portions 622-624, to form the filler cell 650.

As illustratively shown in FIG. 6, the filler cell 650 includes the via structure EV65 disposed between the gate structures G621 and G624. In some embodiments, a width of the via structure EV65 is approximately equal to three CPP.

In some embodiments, the filler cell 630 includes active areas A631, A632 and gate structures G631-G635, and is divided into portions 631-636. As illustratively shown in FIG. 6, each of the gate structures G631-G635 crosses over the active areas A631 and A632. The gate structure G631 is disposed at a boundary of the portions 631 and 632. The gate structure G632 is disposed at a boundary of the portions 632 and 633. The gate structure G633 is disposed at a boundary of the portions 633 and 634. The gate structure G634 is disposed at a boundary of the portions 634 and 635. The gate structure G635 is disposed at a boundary of the portions 635 and 636.

In some embodiments, each of the portions 631-636 corresponds to one CPP. The filler cell 630 has a size of six CPP, and is searched during the operation OP53. At the operation OP54, the portions 632-635 are removed. Alternatively stated, the gate structures G632-G634 and parts of the active area between the gate structures G631 and G635 are removed. A via structure EV66 is formed at a position of the portions 632-635, to form the filler cell 660.

As illustratively shown in FIG. 6, the filler cell 660 includes the via structure EV66 disposed between the gate structures G631 and G635. In some embodiments, a width of the via structure EV66 is approximately equal to four CPP.

In some embodiments, in response to the operation OP53 being performed to search a filler cell having a size of N CPP, the operation OP54 is performed to replace portions corresponding to (N−2) CPP of the filler cell by a via structure having a size of (N−2) CPP. It is noted that N is a positive integer larger than three.

Referring to FIG. 3C and FIG. 6, the active areas A611, A621 and A631 correspond to the active area A31. The active areas A612, A622 and A632 correspond to the active area A32. The gate structure G611, G621 and G631 correspond to the gate structure G33. The gate structure G612, G622 and G632 correspond to the gate structure G34. The via structures EV64-EV66 correspond to the via structure EV3. Therefore, some descriptions are not repeated for brevity. Referring to FIG. 3E and FIG. 6, in some embodiments, at least one of the filler cells 610, 620 and 630 is included in the epitaxial layer PL3, and operation OP54 is performed to form at least one of the via structures EV64-EV66 in the semiconductor device 300E.

Figure 7A:
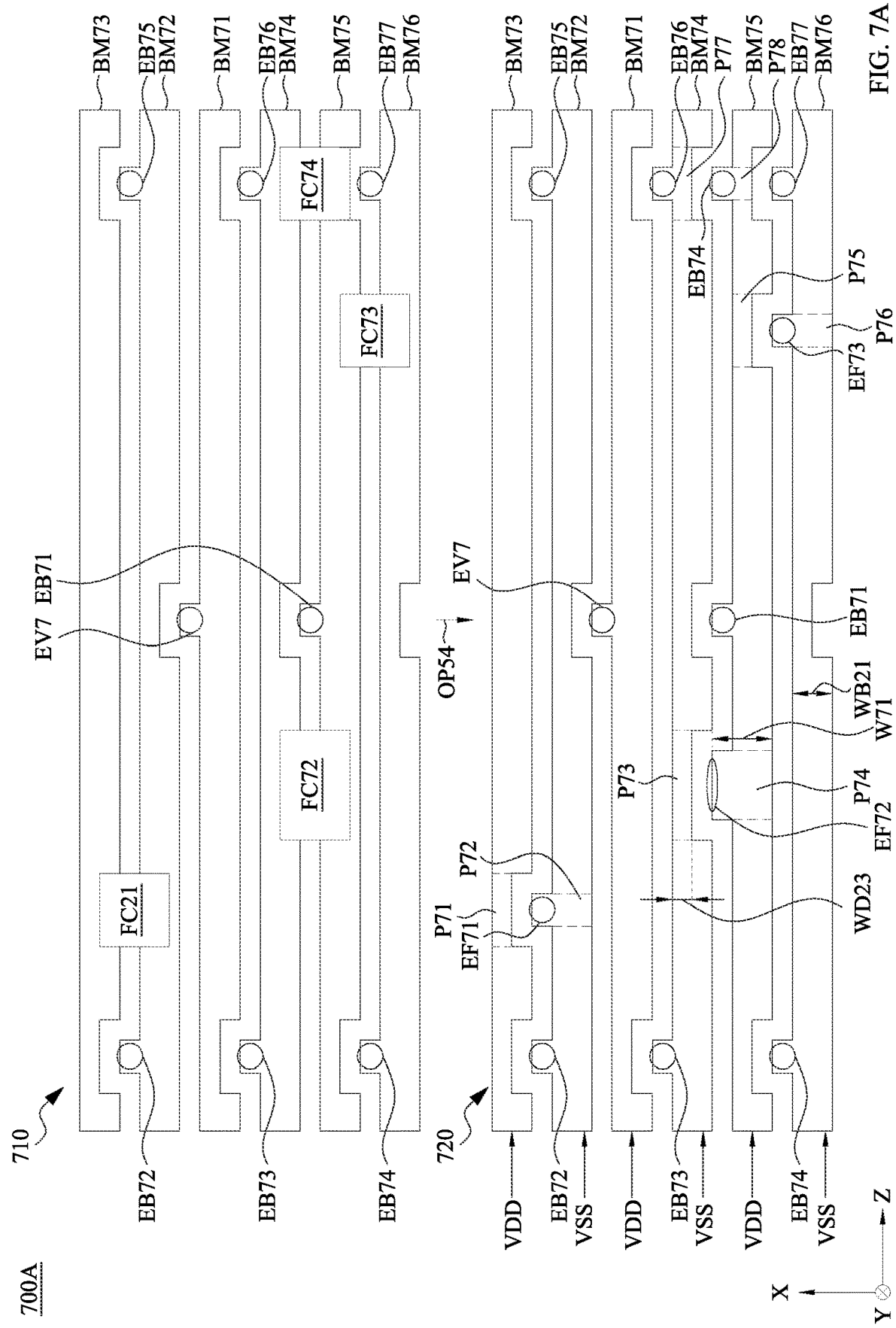
FIG. 7A is a schematic diagram associated with the operation of the method shown in FIG. 5, in accordance with some embodiments of the present disclosure.

FIG. 7A is a schematic diagram 700A associated with the operation OP54 of the method 500 shown in FIG. 5, in accordance with some embodiments of the present disclosure. As illustratively shown in FIG. 7A, the schematic diagram 700A illustrates semiconductor devices 710 and 720. In some embodiments, the operation OP54 is performed to transform the semiconductor device 710 into the semiconductor device 720.

In some embodiments, the semiconductor device 710 includes conductive segments BM71-BM76, via structures EV7, EB71-EB77 and filler cells FC71-FC74. Referring to FIG. 3B and FIG. 7A, the conductive segments BM71-BM76 and the via structures EV7, EB71-EB77 correspond to the conductive segments BM31-BM36 and the via structures EV3, EB31-EB37, respectively. Referring to FIG. 6 and FIG. 7A, the filler cells FC71-FC74 correspond to the filler cells 610, 620 and 630. Therefore, some descriptions are not repeated for brevity.

Referring to FIG. 3E and FIG. 7A, the semiconductor device 710 is an embodiment of the semiconductor device 300E. In some embodiments, the conductive segments BM71-BM76 are included in the conductive layer BML3, and the filler cells FC71-FC74 are included in the epitaxial layer PL3.

As illustratively shown in FIG. 7A, the filler cell FC71 is disposed directly above the conductive segments BM72 and BM73. Each of the filler cells FC72 and FC74 is disposed directly above the conductive segments BM74 and BM75. The filler cell FC73 is disposed directly above the conductive segments BM75 and BM76.

In some embodiments, the semiconductor device 720 includes the conductive segments BM71-BM76, the via structures EV7, EB71-EB77, and via structures EF71-EF74. Referring to FIG. 7A and FIG. 3E, each of the via structures EF71-EF74 is similar with the via structure EV3. For example, each of the via structures EF71-EF74 is disposed through the conductive layer MDL3, the via layers VBL3, VL3 and the epitaxial layer PL3, and is configured to transmit a reference voltage signal from the conductive layer MBL3 to the conductive layer ML3.

As illustratively shown in FIG. 7A, the conductive segments BM73, BM72 and BM76 include portions P71, P72 and P76, respectively. The conductive segment BM74 include portions P73 and P77. The conductive segment BM75 include portions P74, P75 and P78. In some embodiments, before the operation OP54, each of the portions P71-P78 has the width WB21 along the X-direction.

In some embodiments, at the operation OP54, the via structures EF71-EF74 are formed at positions of the filler cells FC71-FC74, respectively. Portions of the conductive segments BM71-BM76 are adjusted to contact with or isolated from the via structures EF71-EF74.

As illustratively shown in FIG. 7A, the portion P72 is elongated along the X-direction to have a width W71 longer than the width WB21, such that the portion P72 contacts with the via structure EF71. The portion P71 is shortened along the X-direction to have the width WD23 shorter than the width WB21, such that the portion P71 is isolated from the via structure EF71.

Similarly, each of the portions P74, P76 and P78 is elongated along the X-direction to have the width W71, such that the portions P74, P76 and P78 contact with the via structures EF72-EF74, respectively. Each of the portions P73, P75 and P77 is shortened along the X-direction to have the width WD23, such that the portions P73, P75 and P77 are isolated from the via structures EF72-EF74, respectively.

In some embodiments, the conductive segment BM72 is configured to provide the reference voltage signal VSS to the via structures EB72, EB75 and EF71. The conductive segment BM71 is configured to provide the reference voltage signal VDD to the via structure EV7. The conductive segment BM74 is configured to provide the reference voltage signal VSS to the via structures EB73 and EB76. The conductive segment BM75 is configured to provide the reference voltage signal VDD to the via structures EF72, EB71 and EF74. The conductive segment BM76 is configured to provide the reference voltage signal VSS to the via structures EF73, EB74 and EB77.

Figure 7B:
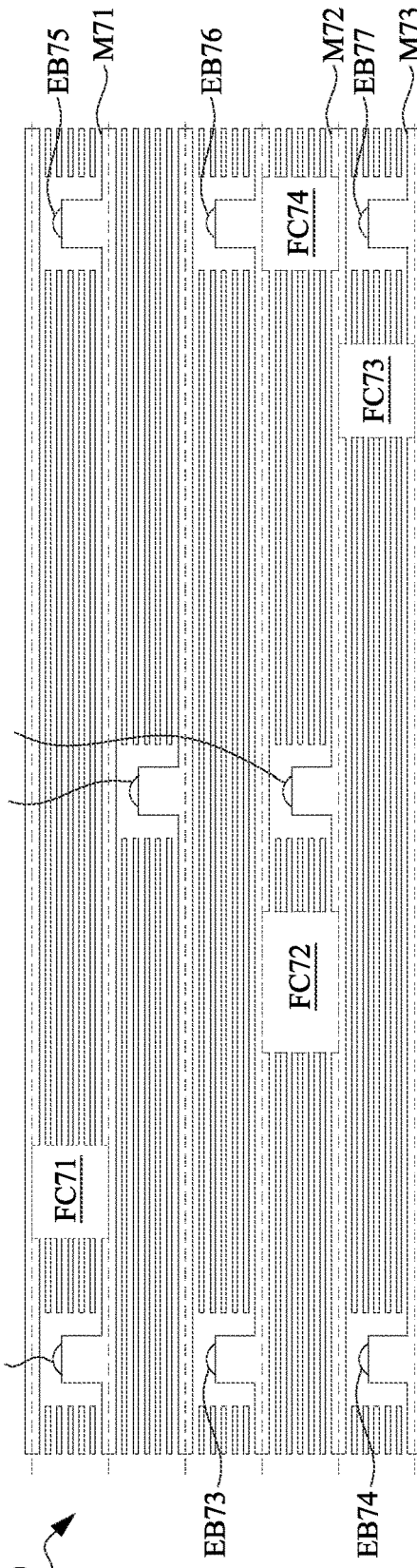
FIG. 7B is a schematic diagram associated with the operation of the method shown in FIG. 5, in accordance with some embodiments of the present disclosure.
Figure 7B:
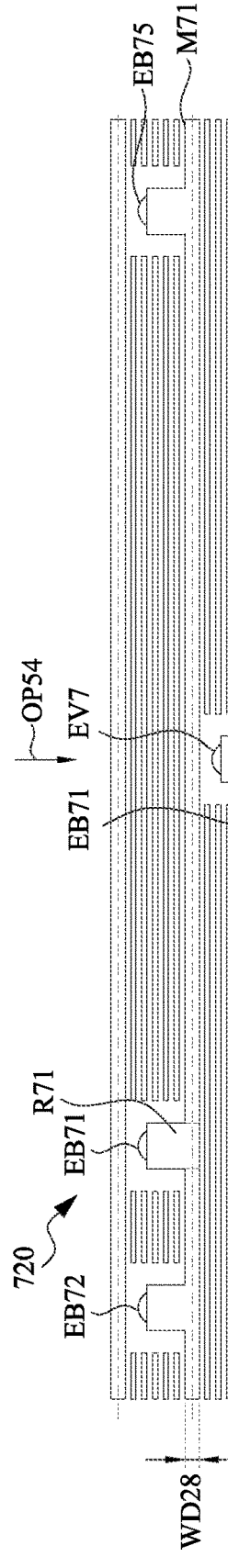
Figure 7B:
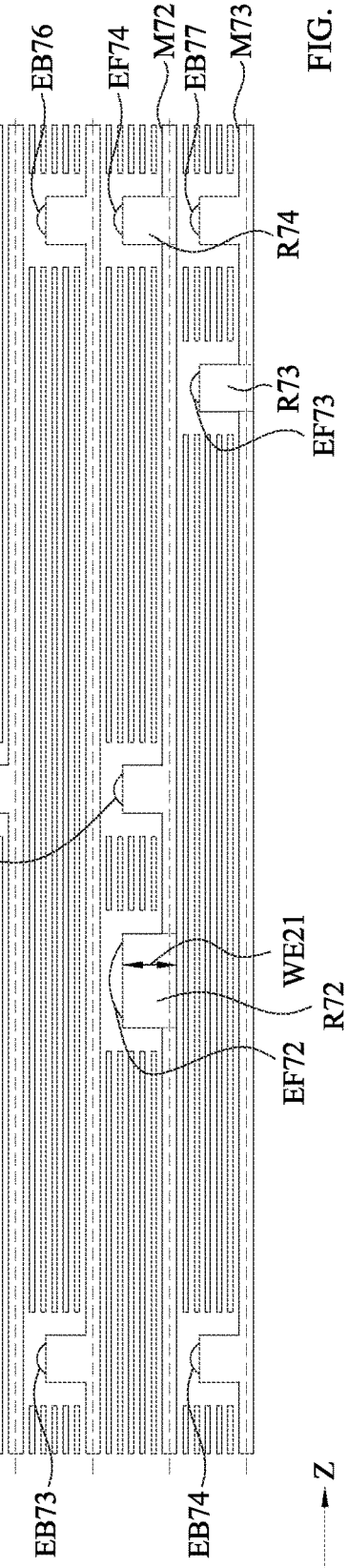

FIG. 7B is a schematic diagram 700B associated with the operation OP54 of the method 500 shown in FIG. 5, in accordance with some embodiments of the present disclosure. As illustratively shown in FIG. 7B, the schematic diagram 700A illustrates the semiconductor devices 710 and 720. The operation OP54 is performed to transform the semiconductor device 710 into the semiconductor device 720.

In some embodiments, the semiconductor device 710 further includes conductive segments M71-M73. Referring to FIG. 3F and FIG. 7B, the conductive segments M71-M73 correspond to the conductive segments ME32, ME37 and ME36, respectively. Therefore, some descriptions are not repeated for brevity.

Referring to FIG. 3E and FIG. 7B, the semiconductor device 710 is an embodiment of the semiconductor device 300E. In some embodiments, the conductive segments conductive segments M71-M73 are included in the conductive layer MEL3.

As illustratively shown in FIG. 7B, the filler cell FC71 is disposed directly below the conductive segment M71. Each of the filler cells FC72 and FC74 is disposed directly below the conductive segment M72. The filler cell FC73 is disposed directly below the conductive segment M73.

In some embodiments, the semiconductor device 720 includes the conductive segments M71-M73 and the via structures EF71-EF74. The conductive segments M71 and M73 include portions R71 and R73, respectively. The conductive segment M72 include portions R72 and R74. In some embodiments, before the operation OP54, each of the portions R71-R74 has the width WD28 along the X-direction.

In some embodiments, at the operation OP54, the via structures EF71-EF74 are formed at positions of the filler cells FC71-FC74, respectively. Portions of the conductive segments M71-M73 are adjusted to contact with corresponding one or more of the via structures EF71-EF74.

As illustratively shown in FIG. 7B, the portion R71 is elongated along the X-direction to have the width WE21 longer than the width WD28, such that the portion R71 contacts with the via structure EF71. Similarly, each of the portions R72-R74 is elongated along the X-direction to have the width W71, such that the portions R72-R74 contact with the via structures EF72-EF74, respectively.

Referring to FIG. 7A and FIG. 7B, the portion R71 is configured to receive the reference voltage signal VSS from the portion P72 through the via structure EF71. The portion R72 is configured to receive the reference voltage signal VDD from the portion P74 through the via structure EF72. The portion R73 is configured to receive the reference voltage signal VSS from the portion P76 through the via structure EF73. The portion R74 is configured to receive the reference voltage signal VDD from the portion P78 through the via structure EF74.

Also disclosed is a semiconductor device. The semiconductor device includes a first conductive layer, a second conductive layer, a first epitaxial structure and a first via structure. The first conductive layer extends along a first direction, and is configured to provide a first reference voltage signal. The second conductive layer extends along the first direction, and is separated from the first conductive layer along a second direction different from the first direction. The first epitaxial structure is disposed between the first conductive layer and the second conductive layer, and has a first width along the first direction. The first via structure is disposed between the first conductive layer and the second conductive layer, is configured to transmit the first reference voltage signal from the first conductive layer through the second conductive layer to the first epitaxial structure. The first via structure has a second width along the first direction. The second width is approximately equal to or larger than twice of the first width.

Also disclosed is a method. The method includes: forming an epitaxial layer between a first conductive layer and a second conductive layer; and forming a first via structure to replace a part of a filler cell in the epitaxial layer, and to contact the first conductive layer and the second conductive layer.

Also disclosed is a semiconductor device. The semiconductor device includes a first conductive segment, a first via structure, a second conductive segment and a first epitaxial structure. The first conductive segment is configured to provide a first reference voltage signal, and comprises a first portion, a second portion and a third portion arranged in order along a first direction, each of the first portion and the third portion having a first width along a second direction different from the first direction, the second portion having a second width different from the first width along the second direction. The first via structure is disposed between the first portion and the third portion. The second conductive segment extends along the first direction, and is disposed above the first conductive segment. The first epitaxial structure is disposed between the first conductive segment and the second conductive segment, and is configured to receive the first reference voltage signal through the first via structure and the second conductive segment in order.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an epitaxial layer between a first conductive layer and a second conductive layer; and
   forming a first via structure to replace a part of a filler cell in the epitaxial layer, and to contact the first conductive layer and the second conductive layer,
   wherein for N being an integer larger than three, in response to a size of the filler cell being larger than N poly pitches, the part corresponds to (N−2) poly pitches, and
   a width of the first via structure is approximately equal to (N−2) poly pitches.

2. The method of claim 1, further comprising:
   forming a first conductive segment and a second conductive segment in the first conductive layer, comprising:
      forming a first portion of the first conductive segment having a first width along a first direction, to contact the first conductive segment with the first via structure; and
      forming a second portion of the second conductive segment having a second width along the first direction, to isolate the second conductive segment from the first via structure,
   wherein the first conductive segment and the second conductive segment are disposed directly below the filler cell, and
   the first width is larger than the second width.

3. The method of claim 2, further comprising:
   forming a third conductive segment in the second conductive layer, comprising:
      forming a third portion of the third conductive segment having a third width along the first direction, to contact the third conductive segment with the first via structure; and
      forming the third portion between two portions of the third conductive segment,
   wherein the first via structure is configured to transmit a reference voltage signal from the first conductive segment to the second conductive segment, and
   along the first direction, each of the two portions has a fourth width smaller than the third width.

4. The method of claim 1, further comprising:
   forming a first epitaxial structure disposed between the first conductive layer and the second conductive layer,
   wherein the first via structure is configured to transmit a first reference voltage signal from the first conductive layer through the second conductive layer to the first epitaxial structure.

5. A method, comprising:
   forming a first conductive layer extending along a first direction, and configured to provide a first reference voltage signal;
   forming a second conductive layer extending along the first direction, and separated from the first conductive layer along a second direction different from the first direction;
   forming a first epitaxial structure disposed between the first conductive layer and the second conductive layer, and having a first width along the first direction; and
   forming a first via structure disposed between the first conductive layer and the second conductive layer, and configured to transmit the first reference voltage signal from the first conductive layer through the second conductive layer to the first epitaxial structure,
   wherein the first via structure has a second width along the first direction, and
   the second width is approximately equal to or larger than twice of the first width.

6. The method of claim 5, further comprising:
   forming a first conductive segment extending along a third direction different from the first direction and the second direction, forming the first conductive segment comprising:
      forming a first portion having a third width along the first direction;
      forming a second portion having the third width along the first direction; and
      forming a third portion having a fourth width along the first direction, and
   disposed between the first portion and the second portion,
      wherein the fourth width is different from the third width, and
      the first via structure is disposed between the first portion and the second portion.

7. The method of claim 6, further comprising:
   forming a second conductive segment disposed between the first epitaxial structure and the first conductive layer, and extending along the third direction, forming the second conductive segment comprising:
      forming a fourth portion having the fourth width along the first direction, and disposed between the first portion and the second portion,
      wherein the first via structure is disposed between the fourth portion and the third portion.

8. The method of claim 5, further comprising:
   forming a second via structure disposed between the first conductive layer and the second conductive layer, and configured to transmit a second reference voltage signal from the first conductive layer to the second conductive layer; and
   forming a first conductive segment disposed between the first epitaxial structure and the first conductive layer, disposed between the second via structure and the first via structure, and extending along a third direction different from the first direction and the second direction, forming the first conductive segment comprising:
      forming a first portion having a third width along the first direction;
      forming a second portion having the third width along the first direction; and
      forming a third portion having a fourth width along the first direction, and disposed between the first portion and the second portion,
      wherein the fourth width is larger than the third width, and
      the second reference voltage signal is different from the first reference voltage signal.

9. The method of claim 5, further comprising:
   forming a first conductive segment disposed between the first epitaxial structure and the first conductive layer, and extending along a third direction different from the first direction and the second direction,
   wherein the first conductive segment comprises a first portion, a second portion, a third portion, a fourth portion and a fifth portion arranged in order along the third direction,
   each of the first portion and the fifth portion has a third width along the first direction, each of the second portion and the fourth portion has a fourth width along the first direction and contacting with the first via structure,
the third portion has a fifth width along the first direction, and contacts with the first via structure,
the fifth width is larger than the fourth width, and
the fourth width is larger than the third width.

10. The method of claim 5, further comprising:
forming a first conductive segment disposed between the first conductive layer and the second conductive layer, and separated from the first via structure along the first direction; and
forming a second conductive segment disposed between the first conductive layer and the second conductive layer, separated from the first via structure along the first direction, and configured to receive a second reference voltage signal different from the first reference voltage signal,
wherein forming the first conductive layer comprises:
forming a third conductive segment extending along the first direction, and configured to provide the first reference voltage signal to the first conductive segment and the first via structure, and
the first via structure is disposed between the first conductive segment and the second conductive segment.

11. The method of claim 5, wherein forming the second conductive layer comprises:
forming a first conductive segment extending along a third direction different from the first direction and the second direction; and
forming a second conductive segment extending along the third direction, and forming the second conductive segment comprising:
forming a first portion contacting with the first via structure, and configured to transmit the first reference voltage signal from the first via structure to the first conductive segment;
forming a second portion separated from the first portion; and
forming a third portion separated from the first portion, wherein the first portion is disposed between the second portion and the third portion.

12. The method of claim 5, wherein forming the second conductive layer comprises:
forming a first conductive segment extending along a third direction different from the first direction and the second direction, and comprising a first portion and a second portion separated from each other; and
forming a second conductive segment extending along the third direction, and forming the second conductive segment comprising:
forming a third portion contacting with the first via structure, having a third width along the first direction, and disposed between the first portion and the second portion;
forming a fourth portion having a fourth width along the first direction; and
forming a fifth portion having the fourth width along the first direction,
wherein the third portion is disposed between the fourth portion and the fifth portion, and
the fourth width is smaller than the third width.

13. The method of claim 5, wherein forming the first conductive layer comprises:
forming a first conductive segment extending along a third direction different from the first direction and the second direction, and forming the first conductive segment comprising:
forming a first portion having a third width along the first direction;
forming a second portion having the third width along the first direction; and
forming a third portion contacting with the first via structure, having a fourth width along the first direction, and disposed between the first portion and the second portion,
wherein the fourth width is larger than the third width.

14. The method of claim 13, further comprising:
forming a second via structure disposed between the first conductive layer and the second conductive layer, and configured to transmit a second reference voltage signal from the first conductive layer to the second conductive layer,
wherein the first conductive segment is disposed between the first via structure and the second via structure, and
forming the first conductive segment further comprises:
forming a fourth portion having the third width along the first direction; and
forming a fifth portion having a fifth width along the first direction, and disposed between the fourth portion and the second portion,
wherein the third width is larger than the fifth width.

15. The method of claim 5, wherein forming the second conductive layer comprises:
forming a first conductive segment extending along a third direction different from the first direction and the second direction, and comprising a first portion and a second portion separated from each other,
wherein the first via structure is disposed through the second conductive layer and disposed between and separated from the first portion and the second portion.

16. A method, comprising:
forming a first conductive segment configured to provide a first reference voltage signal, and comprising a first portion, a second portion and a third portion arranged in order along a first direction, each of the first portion and the third portion having a first width along a second direction different from the first direction, the second portion having a second width different from the first width along the second direction;
forming a first via structure disposed between the first portion and the third portion;
forming a second conductive segment extending along the first direction, and disposed above the first conductive segment; and
forming a first epitaxial structure disposed between the first conductive segment and the second conductive segment, and configured to receive the first reference voltage signal through the first via structure and the second conductive segment in order.

17. The method of claim 16, further comprising:
forming a third conductive segment comprising a fourth portion, a fifth portion and a sixth portion arranged in order along the first direction, each of the fourth portion and the sixth portion having the first width along the second direction, the fifth portion having a third width smaller than the first width along the second direction,
wherein the first via structure is disposed between the first conductive segment and the third conductive segment, and is disposed between the fourth portion and the sixth portion.

18. The method of claim 17, further comprising:
forming a second via structure configured to provide a second reference voltage signal different from the first reference voltage signal to the third conductive segment, and separated from the first via structure by a fourth width along the first direction; and
forming a third via structure configured to provide the second reference voltage signal to the third conductive segment, and separated from the second via structure by a fifth width along the first direction,
wherein the first via structure is disposed between the second via structure and the third via structure, and
the fifth width is approximately twice of the fourth width.

19. The method of claim 18, further comprising:
forming a fourth conductive segment comprising a seventh portion, an eighth portion and a ninth portion arranged in order along the first direction, each of the seventh portion and the ninth portion having a sixth width along the second direction, the eighth portion having a seventh width smaller than the sixth width along the second direction,
wherein the seventh portion and the ninth portion contact with the second via structure and the third via structure, respectively.

20. The method of claim 18, further comprising:
forming a fourth conductive segment comprising a seventh portion, an eighth portion and a ninth portion arranged in order along the first direction; and
forming a fifth conductive segment crossing over and coupled to the eighth portion and the second conductive segment,
wherein the seventh portion, the eighth portion and the ninth portion are separated from each other.

* * * * *